United States Patent [19]

Schaefer et al.

[11] Patent Number: 5,787,010
[45] Date of Patent: Jul. 28, 1998

[54] ENHANCED DYNAMIC PROGRAMMING METHOD FOR TECHNOLOGY MAPPING OF COMBINATIONAL LOGIC CIRCUITS

[76] Inventors: Thomas J. Schaefer, 10610 E. Estates Dr., Cupertino, Calif. 95014; Robert D. Shur, 390 Cecelia Way, Los Altos, Calif. 94022

[21] Appl. No.: 870,860

[22] Filed: Jun. 6, 1997

Related U.S. Application Data

[63] Continuation of Ser. No. 862,100, Apr. 2, 1992, abandoned.

[51] Int. Cl.[6] ........................................ G06F 15/00
[52] U.S. Cl. ........................ 364/489; 364/488; 364/490; 364/491
[58] Field of Search ........................ 364/488, 489, 364/490, 491; 395/500; 326/113, 50

[56] References Cited

U.S. PATENT DOCUMENTS

| | | | |
|---|---|---|---|
| 5,113,352 | 5/1992 | Finnerty | 364/490 |
| 5,187,784 | 2/1993 | Rowson | 395/500 |
| 5,189,629 | 2/1993 | Kohnen | 364/490 |
| 5,202,840 | 4/1993 | Wong | 364/490 |
| 5,237,514 | 8/1993 | Curtin | 364/490 |
| 5,251,147 | 10/1993 | Finnerty | 364/490 |
| 5,257,201 | 10/1993 | Berman et al. | 364/489 |
| 5,396,435 | 3/1995 | Ginetti | 364/489 |
| 5,436,849 | 7/1995 | Drumm | 364/490 |

OTHER PUBLICATIONS

Keutzer, K., "DAGON: Technology Binding and Local Optimization," 1987, *24th ACM/IEEE Design Automation Conference*, pp. 341–347, Jan. 1987.

Detjeus, E., et al., "Technology Mappig in MIS," 1987, *ICCAD*, pp. 116–119, May 1987.

Gregory, D., et al., "Socrates: A System for Automatically Synthesizing and Optimizing Combinational Logic," 1986, *23rd Design Automation Conference*, pp. 79–85, Jan. 1986.

Crastes, M., et al., "A Technology Mapping Method Based on Perfect and Semi-Perfect Matchings," 1991, *28th ACM/IEEE Design Automation Conference*, pp. 93–98, Jul. 1991.

Lisanke, R., et al., "McMAP: A Fast Technology Mapping Procedure for Multi-Level Logic Synthesis," *IEEE Design Automation Conference*, pp. 341–347, May 1988.

*Primary Examiner*—Jacques H. Louis-Jacques

[57] ABSTRACT

A circuit optimization method in which a set of cost functions are stored for each node that indicate the cost of getting signals to that node and the cost of a gate at that node. By "cost", is meant some figure of merit, such as: the maximal delay for a signal to arrive at a node G; or the area of the elements needed to produce the signal at node G. These cost functions enable the circuit to be optimized without the need for a pattern library and the pattern matching process that is typical of other optimization processes, such as the DAGON Node Tiling Procedure.

8 Claims, 16 Drawing Sheets

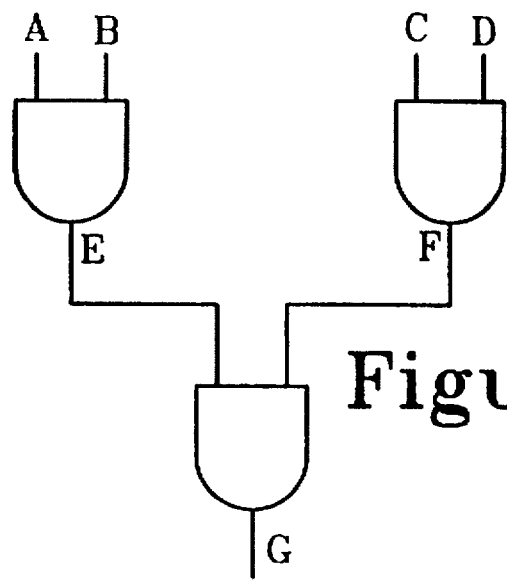
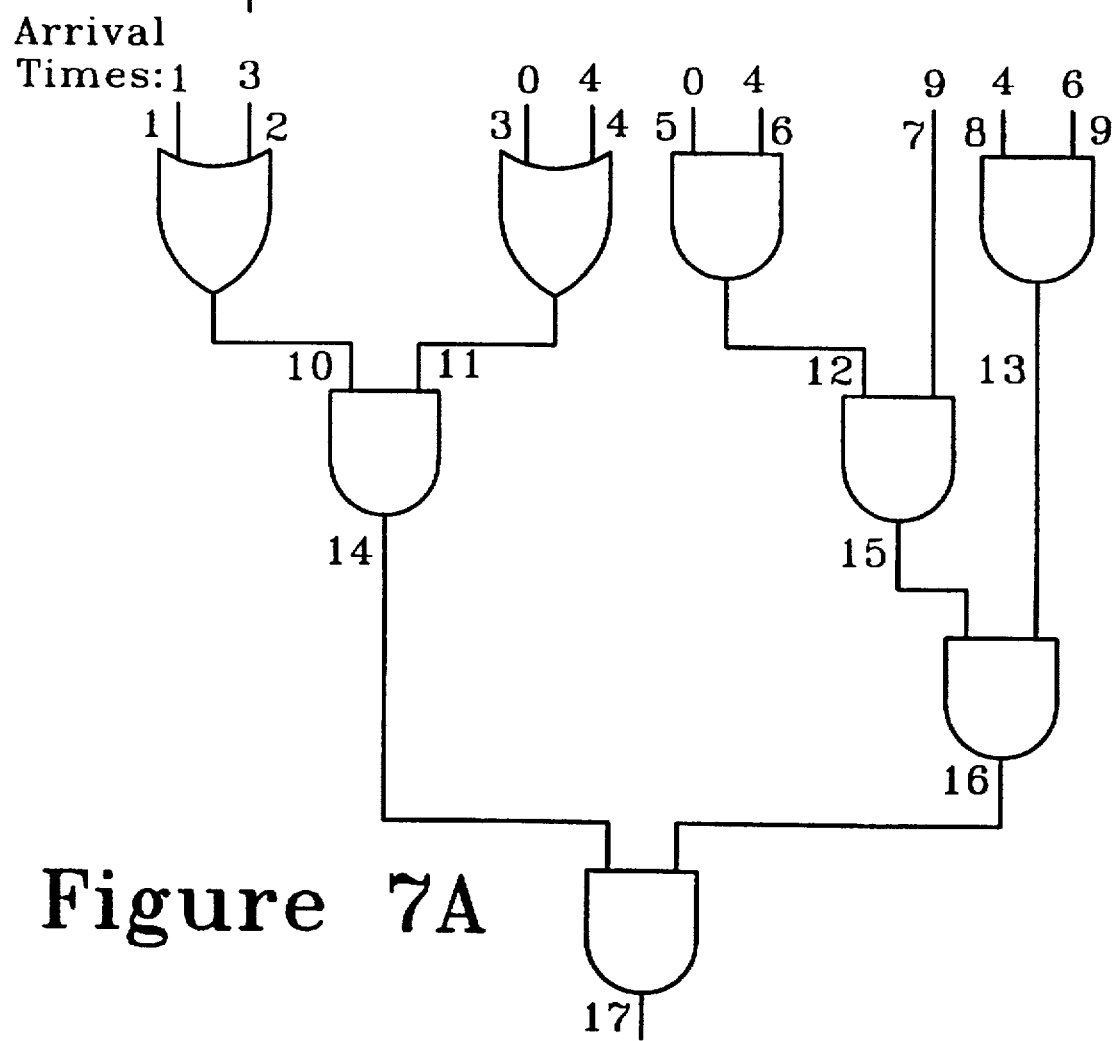
Figure 6
Figure 7A

LIBRARY CELLS (Numbers Indicate Input-to-output Delay)

AND GATES:

OR GATES:

NAND GATES:

NOR GATES:

INVERTER:

Cost Criterion is Time.
Figure 7A illustrates circuit before mapping.
Figure 7B illustrates available gates in library and associated delay times.
Figure 8A illustrates tiling on circuit of Figure 7A.
Figure 8B illustrates tiling result.

Step 1. Input Nodes

| Node G | 1 | 2 | 3 | 4 | 5 | 6 | 7 | 8 | 9 |
|---|---|---|---|---|---|---|---|---|---|
| nodetype(G) | Input | Input | Input | Input | Input | Input | Input | Input | Input |
| $W_{MAX}(G)$ | 1 | 1 | 1 | 1 | 1 | 1 | 1 | 1 | 1 |
| cost(G,1) | 1 | 3 | 0 | 4 | 0 | 4 | 9 | 4 | 6 |

Figure 7C

Step 2. Non-Input Nodes

| Node G | 10 | 11 | 12 | 13 | 14 | 15 | 16 | 17 |
|---|---|---|---|---|---|---|---|---|
| $nodetype(G)$ | OR | OR | AND | AND | AND | AND | AND | AND |
| $left(G)$ | 1 | 3 | 5 | 8 | 10 | 12 | 15 | 14 |
| $right(G)$ | 2 | 4 | 6 | 9 | 11 | 7 | 13 | 16 |
| $i_{MAX}$ | 1 | 1 | 1 | 1 | 1 | 2 | 3 | 2 |
| $j_{MAX}$ | 1 | 1 | 1 | 1 | 1 | 1 | 2 | 3 |
| $W_{MAX}$ | 2 | 2 | 2 | 2 | 2 | 3 | 4 | 4 |
| $a(G,1,1)$ | 3 | 4 | 4 | 6 | 12 | 11 | 18 | 23 |
| $cost(G,2)$ | 3 | 4 | 4 | 6 | 12 | 11 | 18 | 23 |
| $partition(G,2)$ | 1 | 1 | 1 | 1 | 1 | 1 | 1 | 1 |
| $a(G,1,2)$ | | | | | | | 18 | 19 |
| $a(G,2,1)$ | | | | | | 9 | 13 | 23 |
| $cost(G,3)$ | | | | | | 9 | 13 | 19 |
| $partition(G,3)$ | | | | | | 2 | 2 | 1 |
| $a(G,1,3)$ | | | | | | | | 19 |
| $a(G,2,2)$ | | | | | | | 11 | 18 |
| $a(G,3,1)$ | | | | | | | 13 | |
| $cost(G,4)$ | | | | | | | 11 | 18 |
| $partition(G,4)$ | | | | | | | 2 | 2 |
| $d(G,AND,2)$ | | | 11 | 13 | 19 | 18 | 25 | 30 |
| $d(G,OR,2)$ | 11 | 12 | | | | | | |
| $d(G,AND,3)$ | | | | | | 19 | 23 | 29 |
| $d(G,OR,3)$ | | | | | | | | |
| $d(G,AND,4)$ | | | | | | | 24 | 31 |
| $d(G,OR,4)$ | | | | | | | | |
| $cost(G,1)$ | 11 | 12 | 11 | 13 | 19 | 18 | 23 | 29 |
| $tiletype(G)$ | OR | OR | AND | AND | AND | AND | AND | AND |
| $tilewidth(G)$ | 2 | 2 | 2 | 2 | 2 | 2 | 3 | 3 |

Figure 7D

Cost Criterion is Time.
Figure 7A illustrates circuit before mapping.
Figure 7B illustrates available gates in library and associated delay times.
Figure 9A illustrates tiling on circuit of Figure 7A.
Figure 9B illustrates tiling result.

Step 1. Input Nodes

| Node G | 1 | 2 | 3 | 4 | 5 | 6 | 7 | 8 | 9 |
|---|---|---|---|---|---|---|---|---|---|
| nodetype-(G) | Input | Input | Input | Input | Input | Input | Input | Input | Input |
| inverted-(G) | 0 | 0 | 0 | 0 | 0 | 0 | 0 | 0 | 0 |
| $W_{MAX}(G)$ | 1 | 1 | 1 | 1 | 1 | 1 | 1 | 1 | 1 |
| cost-(G,1) | 1 | 3 | 0 | 4 | 0 | 4 | 9 | 4 | 6 |
| costComp-(G,1) | 5 | 7 | 4 | 8 | 4 | 8 | 13 | 8 | 10 |

Figure 9C

Step 2. Non-Input Nodes

| Node G | 10 | 11 | 12 | 13 | 14 | 15 | 16 | 17 |
|---|---|---|---|---|---|---|---|---|
| nodetype(G) | OR | OR | AND | AND | AND | AND | AND | AND |
| left(G) | 1 | 3 | 5 | 8 | 10 | 12 | 15 | 14 |
| right(G) | 2 | 4 | 6 | 9 | 11 | 7 | 13 | 16 |
| $i_{MAX}$ | 1 | 1 | 1 | 1 | 1 | 2 | 3 | 2 |
| $j_{MAX}$ | 1 | 1 | 1 | 1 | 1 | 1 | 2 | 3 |
| $W_{MAX}$ | 2 | 2 | 2 | 2 | 2 | 3 | 4 | 4 |
| a(G,1,1) | 3 | 4 | 4 | 6 | 12 | 11 | 18 | 22 |
| cost(G,2) | 3 | 4 | 4 | 6 | 12 | 11 | 18 | 22 |
| partition(G,2) | 1 | 1 | 1 | 1 | 1 | 1 | 1 | 1 |

Figure 9D

| Node G | 10 | 11 | 12 | 13 | 14 | 15 | 16 | 17 |
|---|---|---|---|---|---|---|---|---|
| a(G,1,2) | | | | | | | 18 | 18 |
| a(G,2,1) | | | | | | 9 | 13 | 22 |
| cost(G,3) | | | | | | 9 | 13 | 18 |
| partition(G,3) | | | | | | 2 | 2 | 1 |
| a(G,1,3) | | | | | | | | 16 |
| a(G,2,2) | | | | | | | 11 | 18 |
| a(G,3,1) | | | | | | | 13 | |
| cost(G,4) | | | | | | | 11 | 16 |
| partition(G,4) | | | | | | | 2 | 1 |
| b(G,1,1) | 7 | 8 | 8 | 10 | 10 | 13 | 16 | 21 |
| costComp(G,2) | 7 | 8 | 8 | 10 | 10 | 13 | 16 | 21 |
| partitionComp(G,2) | 1 | 1 | 1 | 1 | 1 | 1 | 1 | 1 |
| b(G,1,2) | | | | | | | 16 | 17 |
| b(G,2,1) | | | | | | 13 | 13 | 21 |
| costComp(G,3) | | | | | | 13 | 13 | 17 |
| partitionComp(G,3) | | | | | | 2 | 2 | 1 |
| b(G,1,3) | | | | | | | | 17 |
| b(G,2,2) | | | | | | | 13 | 16 |
| b(G,3,1) | | | | | | | 13 | |
| costComp(G,4) | | | | | | | 13 | 16 |
| partitionComp(G,4) | | | | | | | 3 | 2 |
| d(G,AND,2) | | | 11 | 13 | 19 | 18 | 25 | 29 |
| d(G,NAND,2) | | | 9 | 11 | 17 | 16 | 23 | 27 |
| e(G,OR,2) | | | 16 | 18 | 18 | 21 | 24 | 29 |
| e(G,NOR,2) | | | 14 | 16 | 16 | 19 | 22 | 27 |

Figure 9E

| Node G | 10 | 11 | 12 | 13 | 14 | 15 | 16 | 17 |
|---|---|---|---|---|---|---|---|---|
| $d(G,OR,2)$ | 11 | 12 | | | | | | |
| $d(G,NOR,2)$ | 9 | 10 | | | | | | |
| $e(G,AND,2)$ | 14 | 15 | | | | | | |
| $e(G,NAND,2)$ | 12 | 13 | | | | | | |
| $d(G,AND,3)$ | | | | | | 19 | 23 | 28 |
| $d(G,NAND,3)$ | | | | | | 17 | 21 | 26 |
| $e(G,OR,3)$ | | | | | | 23 | 23 | 27 |
| $e(G,NOR,3)$ | | | | | | 22 | 22 | 26 |
| $d(G,OR,3)$ | | | | | | | | |
| $d(G,NOR,3)$ | | | | | | | | |
| $d(G,AND,3)$ | | | | | | | | |
| $d(G,NAND,3)$ | | | | | | | | |
| $d(G,AND,4)$ | | | | | | | 24 | 29 |
| $d(G,NAND,4)$ | | | | | | | 22 | 27 |
| $e(G,OR,4)$ | | | | | | | 28 | 31 |
| $e(G,NOR,4)$ | | | | | | | 25 | 28 |
| $d(G,OR,4)$ | | | | | | | | |
| $d(G,NOR,4)$ | | | | | | | | |
| $e(G,AND,4)$ | | | | | | | | |
| $e(G,NAND,4)$ | | | | | | | | |
| $cost(G,1)$ | 11 | 12 | 11 | 13 | 16 | 18 | 22 | 26 |
| tiletype(G) | OR | OR | AND | AND | NOR | AND | NOR | NOR |
| tilewidth-Comp(G) | 2 | 2 | 2 | 2 | 2 | 2 | 3 | 3 |
| $cost\text{-}comp(G,1)$ | 9 | 10 | 9 | 11 | 17 | 16 | 21 | 26 |
| tiletype-Comp(G) | NOR | NOR | NAND | NAND | NAND | NAND | NAND | NAND |
| tilewidth-Comp(G) | 2 | 2 | 2 | 2 | 2 | 2 | 3 | 3 |

Figure 9F

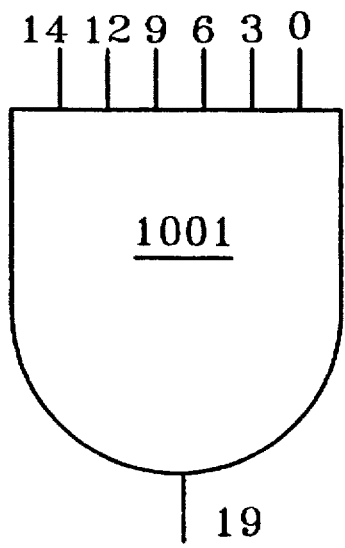
Figure 10A
Figure 10B
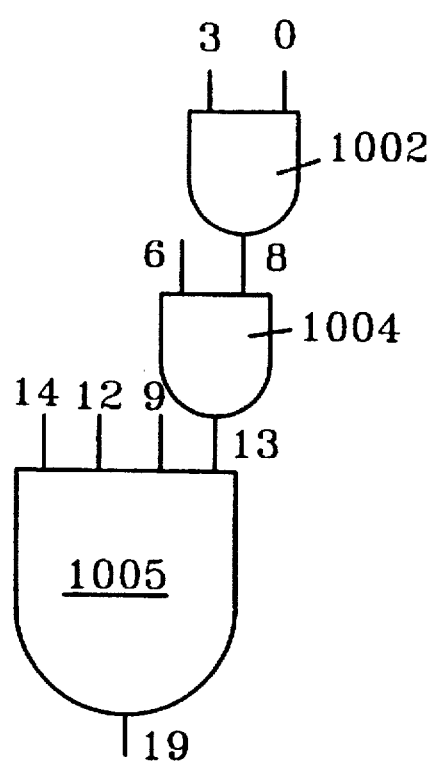
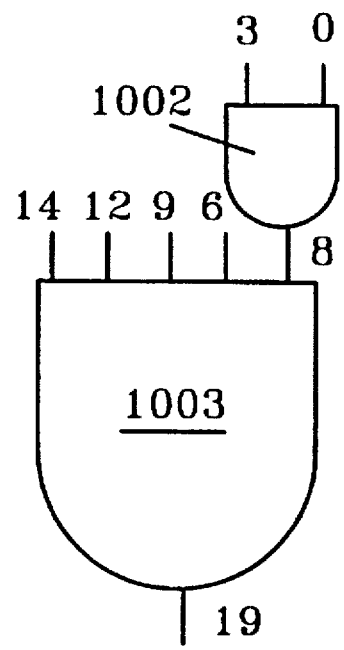
Figure 10C

Figure 10D
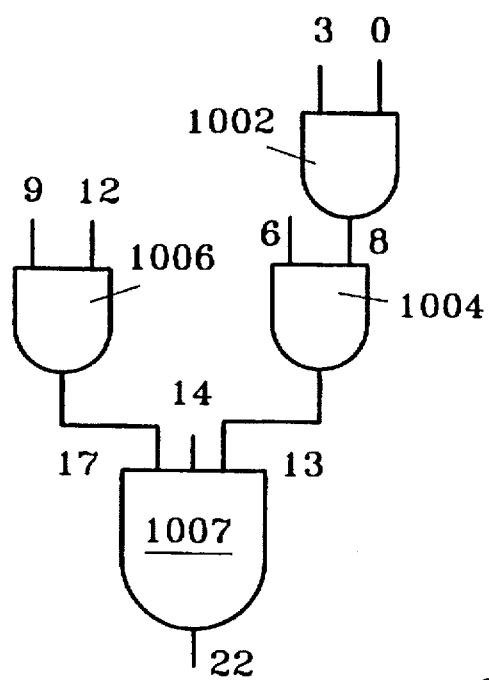
Figure 10E
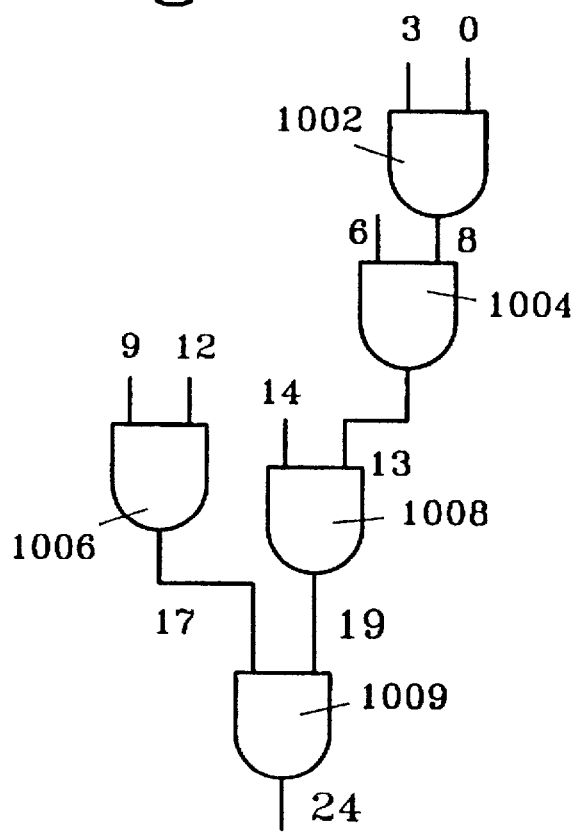
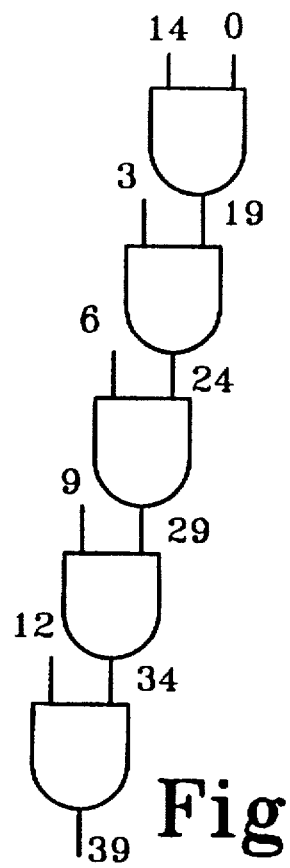
Figure 10F

ENHANCED DYNAMIC PROGRAMMING METHOD FOR TECHNOLOGY MAPPING OF COMBINATIONAL LOGIC CIRCUITS

This application is a continuation of copending application Ser. No. 07/862,100 filed on Apr. 2, 1992, now abandoned.

FIELD OF THE INVENTION

This invention relates generally to computer-aided design systems that facilitate the design of electronic circuits and relates more particularly to a method of converting a technology-independent logic design into an optimized design composed of components from a library of technology-specific components.

Convention Regarding Reference Numerals

In the figures, the first digit of a reference numeral indicates the first figure in which is presented the element indicated by that reference numeral. If an element is in more than one figure, the same reference numeral will be used to identify that element in all such figures.

Definitions

Because of the complexity of this case, several definitions presented below are listed here for easy reference. Each defined word is presented in bold text and quotes to highlight that this is the first use of that defined term. From thence forth in the text, such defined words will be presented as italicized text to point out the meaning of such word has been defined previously.

By "technology" is meant such choices as bipolar, NMOS, CMOS, etc.

By "manufacturing process" is meant the actual chemical and physical steps performed to produce actual integrated circuits.

A "cell" is a circuit, having a fixed, predefined physical layout, that can actually be implemented by the manufacturing process utilized to manufacture a circuit.

A "cell library" is a list of all of the cells that can be implemented by this manufacturing process. This list also includes information about each cell such as its component name (e.g., ANO2D1), its type (e.g., AND gate, OR gate, NAND gate, NOR gate INVERTER) and its number of inputs ("NINPUT").

$N_{MAX}$ is the maximum number of inputs of any AND, OR, NOR, or NAND cell in the cell library.

"Technology Mapping", also referred to as "Technology Binding", is the process of mapping a technology independent description of a circuit into a particular technology and optimizing such mapping.

"Cost" is a figure of merit of components and circuits and is used to measure the optimization of a circuit. Examples of the cost of a component include the area of the component and the maximum delay for a signal to travel through that component.

A "Netlist" is a list of the components of the circuit and their interconnections.

A "combinational block" in an interconnected group of combinational cells.

A "directed, acyclic graph (DAG)" is a collection of nodes and directed edges, in which each directed edge extends from a "start node" to an "end node", and which has no cyclic paths.

A "cyclic path" is a sequence of directed edges, in which the start node of each directed edge other than the first is the end node of the directed edge preceding it in the sequence, and the end node of the last directed edge in the sequence is the same as the start node of the first directed edge in the sequence.

The "in-degree" of a node in a DAG is the number of directed edges having that node as their end node.

The "out-degree" of a node is the number of directed edges having that node as their start node. A "fanout node" is a node whose out-degree is greater than 1.

The "immediate predecessors" of a node G are the nodes F such that there is a directed edge from F to G.

A "tree" is a directed, acyclic graph, having a unique node of out-degree 0, referred to as the "root" of the tree, and in which all nodes other than the root have outdegree one. "Fanout" is the number of signal paths connected to the output of a device.

A "reduced circuit", also known as a "canonical form of the circuit", is an embodiment of the circuit in terms of a base set of 2-input components.

A "tile" is a library cell that can be used to implement a set of contiguous nodes in the reduced circuit.

A "root node" is a unique node of a tree having outdegree zero.

A "leaf node" is any node of a tree that has no immediate predecessor in the tree. "Partitioning" is the process of identifying nodes at which fanout is greater than one and then breaking the circuit into pieces, each of which is a tree.

A "Sub-tree" is any interconnected subset of components of a tree which, by itself, has the form of a tree.

In a "levelized input-to-output order" of action, for every directed edge, the action in regard to the start node of that edge precedes that action for the end node of that edge.

A "pattern library" is a table, which contains, for each cell in the cell library, a list of all possible sub-trees for which that cell is an implementation.

A "binary tree" is a tree in which every nonleaf node has in-degree two.

The "primary cost", is the cost of a tree or a cell as calculated by the Basic Node Tiling Procedure and, for a cell at a node G, is denoted by "cost(G,1)". The cost (G,1) of a library cell C is referred to herein as the "Cost (C)" of library cell C.

The "area cost" of a cell is the area of that cell. The "time cost" of a cell is the maximum time for a signal to propagate through that cell. The "k-cost", is the minimum cost of getting k different signals to a node G from gates of the same type (i.e., AND-type or OR-type) as the gate at node G, but does not include the cost of the gate at node G. This k-cost for a node G is also denoted by "cost(G,k)".

"Basic cells" are AND gates, OR gates, NAND gates, NOR gates and INVERTERs.

A "complex cell" is any library cell that is not a basic cell.

The "partition(G,k) indicates, for a given value of k, how many of these k inputs are drawn from the right tree connected to the 2-input (AND or OR) gate at the Gth node of the reduced tree.

"Left(G)" specifies the node number of the left input of the 2-input gate at node G.

"Right(G)" specifies the node number of the right input of the 2-input gate at node G.

"Nodetype(G)" identifies the gate type for the gate at node G.

The cost of the k-input gate employed at node G as part of the process of calculating the minimum cost of producing a signal at node G is represented as "c(nodetype(G),k)". "a(G,i,j)" is the minimum cost of getting i input signals to the left input of the gate at node G and j input signals to its right input.

"d(G,i,j)" is the total cost of getting k signals to the input G of a gate of type t.

BACKGROUND OF THE INVENTION

In the process of designing circuits, such as logic circuits, the initial design steps typically do not take into account limitations as to what components can actually be produced by the technology and manufacturing process that will be used to produce actual circuits. For example, the initial design steps might produce a design that requires an eight input AND gate, whereas the actual technology and manufacturing process to be used does not produce any logic gates with more than six inputs. It is therefore necessary to convert the initial design into a design that can actually be manufactured by this particular choice of manufacturing processes. This conversion step is referred to herein as "technology mapping" and is also known as "technology binding".

This list of components that can actually be manufactured is referred to as the "cell library" and each component in this cell library is referred to herein as a "cell". For each cell, the library also lists certain physical and electrical properties of that cell, such as the circuit area taken up by that cell and the maximum delay for an input signal to propagate through that cell. In general, even within the limitations imposed by the fact that the cell library contains a limited number of different components, there are many different choices that can be made to implement the circuit. Therefore, as part of the technology binding process, these choices are made to optimize circuit performance.

This optimization can be measured by such factors as the area of the resulting circuit, the maximum signal delay for any signal path through this circuit, or some other factor that provides a meaningful measure of the quality of the resulting circuit. For area and delay measures of quality, optimization means to minimize this factor. The factor that is optimized is referred to herein as the "cost" for this circuit. The degree of optimization and the amount of time required to implement the technology binding is dependent on the particular method of optimization.

It is a common practice in the design of circuits to produce a "netlist", which is a list of the components of the circuit and their interconnections. As a part of the technology mapping process, the original netlist is replaced by a netlist utilizing only components from the cell library. Various methods have been utilized in the selection of cells from the cell library to optimize the cost of the resulting circuit.

A typical sequence of steps for performing netlist optimization is:

(i) convert the input net list into an intermediate technology-independent form, if it is not already in such a form;

(ii) map noncombinational elements into the technology-dependent library;

(iii) identify the "combinational blocks" (i.e. the interconnected groups of combinational cells—Examples of combinational cells are: a 4-input AND gate; a 3-input exclusive-OR gate; and a one-bit adder. Examples of noncombinational cells are: an edge-triggered flip-flop; a three-state buffer; and a level-sensitive latch.);

(iv) perform Boolean optimization of each combinational block, where optimization typically means to reduce the complexity of the logic, such as by minimizing the number of logic elements required to implement the combinational block; and (v) perform technology mapping of each combinational block.

Technology mapping is also utilized in design procedures that do not utilize a Net List. For example, in logic synthesis, high level languages are used to produce a data structure that carries information comparable to a Net List. Regardless of how the technology-independent circuit structure is produced, it is always necessary to convert that structure into a technology-based implementation that is limited by the need to use only cells from the cell library. Similarly, the benefits of optimizing the actual selection of cells from the library is independent of how the high level circuit design was produced or expressed.

In regard to step (v) of the netlist optimization procedure, it is well known that any combinational logic function can be realized as a network composed only of AND gates, OR gates and INVERTERs. Therefore, as part of step (v), each combinational block can be represented in terms of only these three logic gates to produce a canonical representation that facilitates matching of the cells in the cell library with the combinational block.

Because an AND gate can be produced from a NAND gate and an INVERTER and an OR gate can be produced from a NOR gate and an INVERTER, there are a number of other sets of logic gates that can be used as a basis for canonical representation of combinational logic functions. The discussion herein in regard to expressing the combinational logic in terms of only AND gates, OR gates and INVERTERs is equally applicable to these other canonical representations. Since each of these representations is technology-independent, the gates occurring in this description can have an arbitrarily large number of inputs.

In terms of interconnections, combinational logic circuits have the form of a "directed acyclic graph (DAG)". Mathematically, a DAG is defined to be a collection of nodes and directed edges, in which each directed edge extends from a "start node" to an "end node", and which has no cyclic paths. A "cyclic path" is a sequence of directed edges, in which the start node of each directed edge other than the first is the end node of the directed edge preceding it in the sequence, and the end node of the last directed edge in the sequence is the same as the start node of the first directed edge in the secluded.

The following four terms are helpful in characterizing DAGs. The "in-degree" of a node in a DAG is the number of directed edges having that node as their end node. The "out-degree" of a node is the number of directed edges having that node as their start node. A node whose out-degree is greater than 1 is referred to as a "fanout node". The "immediate predecessors" of a node G are the nodes F such that there is a directed edge from F to G.

Any combinational logic circuit can be represented as a directed acyclic graph, in which each node corresponds to a component of the circuit or to an external input or output of the circuit, and in which each directed edge corresponds to a connection from a circuit input or an output pin of a component to a circuit output or input pin of a component. Because there are no cyclic paths, a DAG can be oriented such that the inputs are located at the top of the diagram, the outputs are located at the bottom of the diagram and all edges are directed in a downward direction (i.e., each edge ends at a lower position than its start node).

A number of methods have been proposed for optimizing technology mapping of combinational circuits. In one simple technology mapping process, referred to as "rule-based substitutions", an initial implementation of the logic equation is produced in any manner chosen by the designer. This initial implementation is then scanned to identify portions of it for which one of the rules provides an alternate way to embody that portion of the circuit. If one of these substitutions improves the cost (i.e., the figure of merit) of this circuit, then that substitution is implemented. These steps are repeated until there is no further improvement in the cost.

For example, the initial implementation might contain a pair of 2-input AND gates that are connected such that the output of one of these AND gates is connected to one of the two inputs of the other AND gate (see FIG. 1A). This combination is equivalent to a 3-input AND gate and, if the cell library contains both 2-input and 3-input AND gates, then such equivalence could be included as one of the rules. The cost for each of these elements is also contained in the cell library so that the cost for the altered circuit can be compared against the prior implementation. If the cost is improved by replacing this pair of 2-input AND gates with a single 3-input AND gate, then such replacement is made.

Another example of one of these rules is that the combination of an AND gate followed by an INVERTER is equivalent to a single NAND gate (see FIG. 1B). An example of a more complex rule is to replace a wide gate by an unbalanced decomposition of this gate, with the later arriving signals ($S_1$ and $S_2$) connected to the faster paths through the unbalanced decomposition (see FIG. 1C). An example of a rule-based system is presented in the article by D. Gregory, K. Bartlett, Aart de Geus and Gary Hachtel entitled SOCRATES: A system for automatically synthesizing and optimizing combinational logic, IEEE 23rd Design Automation Conference, 1986, p. 79–85.

In another technology mapping procedure known as "tiling", the combinational circuit is first converted to a canonical form, for example, a form in which each logic gate has at most two inputs. The resulting circuit is a binary tree that is referred to herein as the "reduced circuit" and also known as a "canonical form of the circuit". Its associated DAG is referred to herein as the "reduced DAG" or as the reduced tree, if the DAG is a tree. In this process, sets of contiguous nodes, referred to as "tiles", are identified that exactly implement the function of some library cell. For example, in the circuit of FIG. 2A, the encircled set of nodes implements the AND-OR-INVERT gate presented in FIG. 2B. The tiling procedure attempts to determine a set of tiles that cover every node without having two tiles overlap the same node and that minimizes the cost of the resulting circuit.

In one class of algorithms, referred to as "greedy algorithms", at each step a tile is added that maximizes some figure of merit. Various algorithms have been proposed that begin at either the output or the inputs and tile the tree with the best choice at each node. An example of a greedy tiling algorithm is presented in the article by M. Crastes, K. Sakouti, and G. Saucier entitled A Technology Mapping Method Based On Perfect and Semi-Perfect Matchings, 28th ACM/IEEE Design Automation Conference, p. 93–98. A disadvantage of the greedy tiling algorithms is that, in the final tiling steps, there tend to be many odd-sized clusters of contiguous nodes that are not covered in a cost-effective manner.

A more globally optimal tiling approach is that of DAGON, which is discussed in the article by Kurt Keutzer entitled DAGON: Technology Binding and Local Optimization by DAG Matching, 24th ACM/IEEE Design Automation Conference, 1987, p. 341–347. DAGON uses a tree-based dynamic-programming approach to the tiling problem. DAGON utilizes "trees", which are a DAG that has a unique node of out-degree zero, called the "root node", and in which all other nodes have an out-degree one. FIGS. 3A–3C illustrate three examples of trees. A node of a tree that has no immediate predecessor in the tree is called a "leaf node". As illustrated in FIGS. 4A and 4B, any DAG can be decomposed into trees simply by deleting all of the outgoing edges of each fanout node. Thus, DAGON is a tree-based tiling method in which the DAG of a reduced combinational circuit is decomposed into trees and then each tree is separately tiled such that no tile overlaps more than one tree. This method includes the following three steps.

Step 1: The DAG nodes are listed in a "levelized input-to-output order", in which, for every directed edge, the start node precedes the end node in the levelized list. Any node that is either a fanout node or an external output node, will be referred to herein as a "tree root node", because such node is the root node of a tree when the DAG is decomposed into a forest of trees as described above.

Step 2: The list of nodes is scanned in levelized order and, for each tree root node:

(a) the nodes of the tree rooted at the tree root are identified and a list of these nodes in levelized order is produced;

(b) the tree, which at this point consists of INVERTERs and of AND and OR gates having arbitrarily many inputs, is converted into an equivalent circuit, referred to herein as the "reduced tree", consisting only of 2-input AND gates, 2-input OR gates and INVERTERs. This decomposition is performed in such a way that INVERTERs occur only on leaves of the tree. Such a conversion can readily be performed by a person of average skill in the art. A preferred method of performing this conversion, which is based in part on the paper of Lisanke et al entitled McMAP: A fast technology mapping procedure for multi-level logic synthesis, IEEE International Conference on Computer Design, 1988, p. 252–256, has the following steps:

(i) All INVERTERs are migrated to the leaves of the tree. This is accomplished by repeatedly choosing an INVERTER which is not situated at a leaf and (1) removing the inverter, (2) changing the identity of the gate driving the INVERTER from AND to OR or from OR to AND, and (3) inserting an INVERTER on each input of the changed gate. Whenever one of these steps gives rise to two INVERTERs in series, they are both deleted.

(ii) Each AND or OR gate, in levelized input-to-output order, is decomposed into 2-input versions of the same gate as follows: First, assume that the cost criterion is time. Thus, the arrival time (i.e., the cost) of every leaf node is already known. Form a list of arriving INPUTs, which initially consists of all leaf nodes. Choose from the list of arriving inputs two inputs having the earliest arrival times, and form a 2-input gate having those two inputs as its inputs; delete the two chosen inputs from the list of arriving inputs, and add to the list of arriving inputs the output of the new gate. The arrival time of the output of the new gate is set equal to the later of the arrival times of the two chosen inputs plus a nominal gate delay. The nominal gate delay is a technology dependent constant, which may be chosen to reflect the average delay of two-input gates in the cell library. This process is repeated over and over, choosing two earliest arriving inputs and adding a new gate as just described, until the list of arriving inputs is empty. At that point, the original AND or OR gate has been completely decomposed into 2-input gates of the same type, and the resulting 2-input structure is balanced or unbalanced as appropriate to roughly reflect timing requirements. If the cost criterion is area, a recommended method of decomposing an AND or OR gate is to follow the method just described, initially assigning a cost of zero to all leaf nodes. The result will then be a balanced structure of 2-input gates.

(c) on the reduced tree produced in step 2(b), the Basic Node Tiling Procedure described below is executed to associate with every non-leaf node the name of a library cell (referred to herein as the "optimal tile") that can be mapped to that node and a list (referred to herein as the "optimal mapping") that associates with each INPUT of the optimal tile the node of the tree corresponding to that INPUT;

(d) a new net list for the tree is produced in which the optimal tile for the root node replaces those cells covered by that tile. Each of the input nodes of that optimal tile is either a leaf node of the original tree being tiled or is the root of a cluster of nodes which are themselves a tree. Such a cluster is referred to herein as a "subtree". This procedure (step (c)) is repeated for each of these subtrees. For any given one of these subtrees, this repeated procedure might divide it into its optimal tile and a set of subtrees. If so, the procedure is again repeated for these subtrees and so forth until each node of the original tree has been covered with tiles.

These steps produce a new netlist that implements each tree of the original combinational circuit in terms of cells from the cell library of the technology chosen to implement the circuit. The cells utilized to tile this circuit are selected to minimize the cost of this circuit.

Basic Node Tiling Procedure

Each leaf node of the reduced tree is assigned a cost equal to: the total cost of external circuitry connected to that leaf node, if such leaf node is an INPUT of the circuit; or, if such leaf node is a node of in-degree greater than one, the total cost of the trees whose roots are connected to that node. Therefore, the cost of the root node of a tree is the total cost of implementing that tree and includes both the cost introduced by the elements of that tree as well as the cost of other trees and INPUTs connected to the leaf nodes of that tree. This procedure has the following steps.

For all leaf nodes: If the cost criterion is area, the cost of each noninverting leaf node is set to zero and the cost of each inverting leaf node is set equal to the area of the smallest INVERTER in the cell library. If the cost criterion is time, the cost of each leaf node is set equal to the arrival time of the input signal on that node. For a leaf node that is an external INPUT of the combinational circuit, the arrival time is given as part of the input to the technology mapping problem. For a leaf node that is not an external INPUT of the combinational circuit, the arrival time is equal to the cost (i.e., arrival time) of the tree root that drives that leaf node. This latter arrival time has already been computed, because Step 2 above processes the tree root nodes in levelized input-to-output order.

For each nonleaf node, in levelized input-to-output order:

(1) For each library cell, a pattern matching procedure is executed which produces a list, referred to herein as the "pattern list" of all library cells that can be mapped into that node. Each item in the pattern list consists of: (a) the name of a library cell, referred to herein as the "candidate cell", that can be mapped to the node; and a mapping that associates a tree node with each INPUT of the candidate tile. An example of such a pattern matching procedure is described in the article by K. Keutzer entitled DAGON: Technology Binding and Local Optimization by DAG Matching, IEEE Design Automation Conference, 1988, p. 252–256.

It should be noted that there can be multiple items in the pattern list having the same candidate tile, but with different mappings. An example of this is illustrated in FIGS. 5A–5D which illustrates four different ways to map a 5-input AND gate at the root node of an illustrative circuit. If the candidate tile has INPUTs that are functionally interchangeable, it is not necessary to make a separate pattern list entry for each permutation of those INPUTs. For example, if one entry in the pattern list is a 3-input AND gate with node mapping $(N_1, N_2, N_3)$, it is not necessary to make additional list entries for the same cell with mappings such as $(N_2, N_1, N_3)$, $(N_3, N_2, N_1)$, etc.

(2) For each candidate tile, a cost is computed. If the cost criterion is area, the cost is computed as the sum of: (a) the area of the candidate tile and (b) the sum the costs of all input nodes of the candidate tile. If the cost criterion is time, the cost is computed as the sum of: (a) the input-to-output delay of the candidate tile and; (b) the maximum of the costs of all INPUTs of the candidate tile.

It should be noted that, because this cost analysis is performed in levelized input-to-output order, the cost of each INPUT of the candidate tile has already been computed.

(3) The candidate tile that has the smallest cost is stored as the optimal tile for that node, the associated mapping is stored as the optimal mapping of that node and its cost is stored as the cost of that node.

Unfortunately, there is a major shortcoming of the Basic Node Tiling Procedure—namely, the size of the pattern list for a node can be so large that an inordinate amount of time is required to implement this procedure. For example, FIGS. 5A–5D illustrate four different ways of mapping a 5-input AND gate into an exemplary tree node. In fact, there are exemplary circuits in which there are up to 14 different ways of mapping a 5-input AND gate into a particular tree node. The maximum number of possible mappings increases rapidly with the total number of inputs of the cell being mapped to a given node. For example, for an 8-input AND gate, there are up to 429 different maps and for a 16-input AND gate, there are up to 9,694,845 different maps. Clearly, if the cell library includes AND gates with as many as 8 or 16 inputs, this tiling procedure can require too much time to utilize to be commercially useful. Thus, an improved node tiling procedure is needed that avoids such bottlenecks.

SUMMARY OF THE INVENTION

In accordance with the illustrated preferred embodiments, a technology mapping and optimization procedure is presented, for implementing logic circuits. This procedure produces the same results as the Basic Node Tiling Procedure, but avoids some or all of the time consuming pattern matching steps of the Basic Node Tiling Procedure. This is achieved by the use of a set of cost functions and mappings that enable optimization of the tiling procedure either without need for the time consuming use of pattern matching to select a tile, as is required in the Basic Node Tiling Procedure, or with a reduced need for such pattern matching.

One of these costs, referred to herein as the "primary cost", is the cost of a tree or a cell as calculated by the Basic Node Tiling Procedure. The primary cost for a node G will be denoted herein by "cost(G,1)". The other cost functions, referred to herein as the "k-cost", represent the minimum cost of getting k different signals to node G from gates of the same type (i.e., AND-type or OR-type) as the gate at node G, but does not include the cost of the gate at node G. These k-cost values enable the optimization steps at each AND or OR node to be performed in terms of only data stored at that node and data at immediate precursors of that node. This contrasts with the Basic Node Tiling Procedure which, for optimization at any general node, uses pattern matching steps that require information stored for many other nodes. The k-cost for a node G is denoted as "cost(G,k)". The value of k ranges from 2 up to the maximum number of inputs, $N_{MAX}$ of any AND, OR, NAND or NOR gate in the cell library.

For each cell in the cell library, the cost of that cell is included among the information stored for that cell. This cost, referred to herein as the "cell cost", depends on the type of cost that is to be optimized. Two useful types of cost are the area of the cell (referred to herein as the "area cost") and the maximum time for a signal to propagate through that cell (referred to herein as the "time cost"). In general, it is useful to reduce the size of a cell, so that more cells can be packed in a given area and so that signals have a shorter distance to travel, thereby increasing the speed of operation of a circuit. It is also useful to decrease the time needed to produce signals, so that the circuit will exhibit a greater speed of operation. Therefore, circuit area and signal generation time are useful measures of a circuit. These two types of cost are referred to, respectively, as the area cost or the time cost, depending on which of these cost factors is to be optimized for a given circuit.

All pattern matching can be avoided by utilizing a library that contains only AND, OR, NAND, NOR and INVERTER gates. These types of cells are referred to herein as "basic cells". Any other type of cell, such as an AND-OR-INVERT cell, is referred to herein as a "complex cell". For complex cells, a pattern list of that cell in terms of 2-input AND, OR, and INVERTER cells is included in the library, just as in the Basic Node Tiling Procedure. No pattern list is included for any of the basic cells, because the present optimization process avoids the need for such patterns. During the levelized input-to-output scan, for each node, the costs of the inputs to a node are utilized to calculate the various k-costs of that node. These k-costs and the cost of the k-input basic cell of the same type as the existing cell at that node are used to identify the optimal basic cell that can be utilized at that node. In addition, the Basic Node Tiling Procedure is utilized to determine the optimal complex cell that can be placed at that node. All of this information about that node is stored to enable an optimized tiling of this circuit. The optimal tile of a node is set equal to the optimal basic cell identified using the k-costs, or to the optimal complex cell identified by the Basic Node Tiling Procedure, whichever has lesser cost.

Once this levelized input-to-output scan has been completed, there is sufficient data to make the actual selections that optimize the circuit. To perform this selection, the root node is first tiled by the cell identified as its optimal tile. The cell that is used for this tiling step can be either a complex cell or a basic cell. This cell is referred to as the "tile" used to cover that node. The input nodes of this tile are likewise tiled by the optimal cell for those nodes and so forth until the entire circuit has been tiled.

Although the use of a library having only basic cells would produce the greatest reduction in the amount of time needed to design a given circuit, it would not in general minimize the cost of the resulting circuit. On the other hand, if a large number of complex cells are included in the library, then there will be a lesser improvement in the speed and memory needs of the process of designing the circuit. Therefore, the number and choice of complex cells in the library is determined by a tradeoff of reducing the time and expense of designing a circuit versus the amount of circuit optimization achieved by the design process.

DESCRIPTION OF THE FIGURES

FIG. 6 illustrates a three gate binary tree of 2-input AND gates, which is used to illustrate the meaning of k-cost.

FIG. 7A is a reduced tree representation of a circuit used to illustrate the new optimization procedure.

FIGS. 7C and 7D presents the numerical values produced as part of the optimization procedure are presented herein for the case of the circuit of FIG. 7A and the associated cell library of FIG. 7B.

FIGS. 9C and 9D present the numerical values produced during the optimization procedure of the circuit of FIG. 9A, using the library of FIG. 7B.

FIG. 9E is a table of values associated with the present invention.

FIG. 9F is another table of values associated with the present invention.

FIGS. 10A–10E illustrate an improved method of decomposing a wide gate to produce a reduced circuit implementation of the circuit, wherein cost is measured by the time of arrival of signals and wherein the times of arrival of the input signals for this gate are known.

FIG. 10F illustrates the worst case decomposition of the 6-input AND gate of FIG. 10A.

DESCRIPTION OF THE PREFERRED EMBODIMENT

Figure 1A:
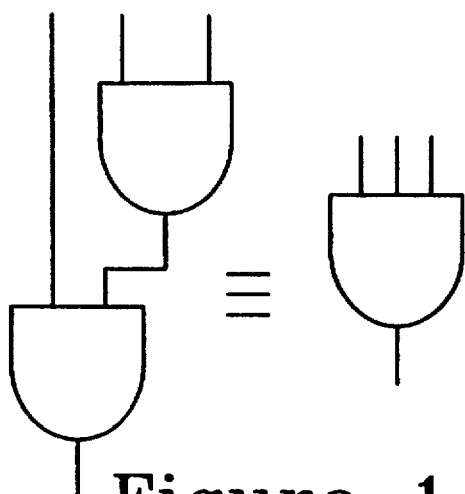
FIGS. 1A–1C three examples of the equivalence between various circuits.
Figure 1B:
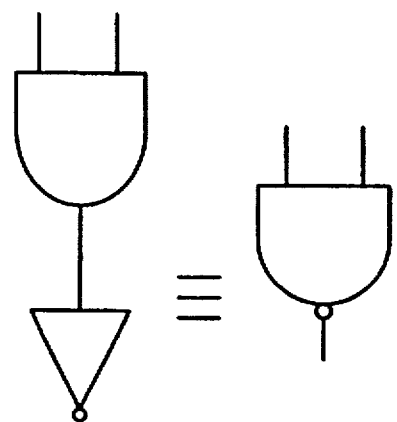
Figure 1C:
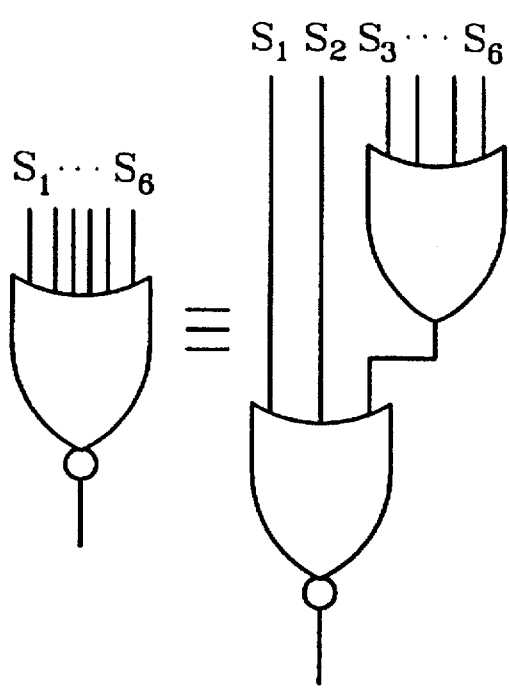
Figure 2A:
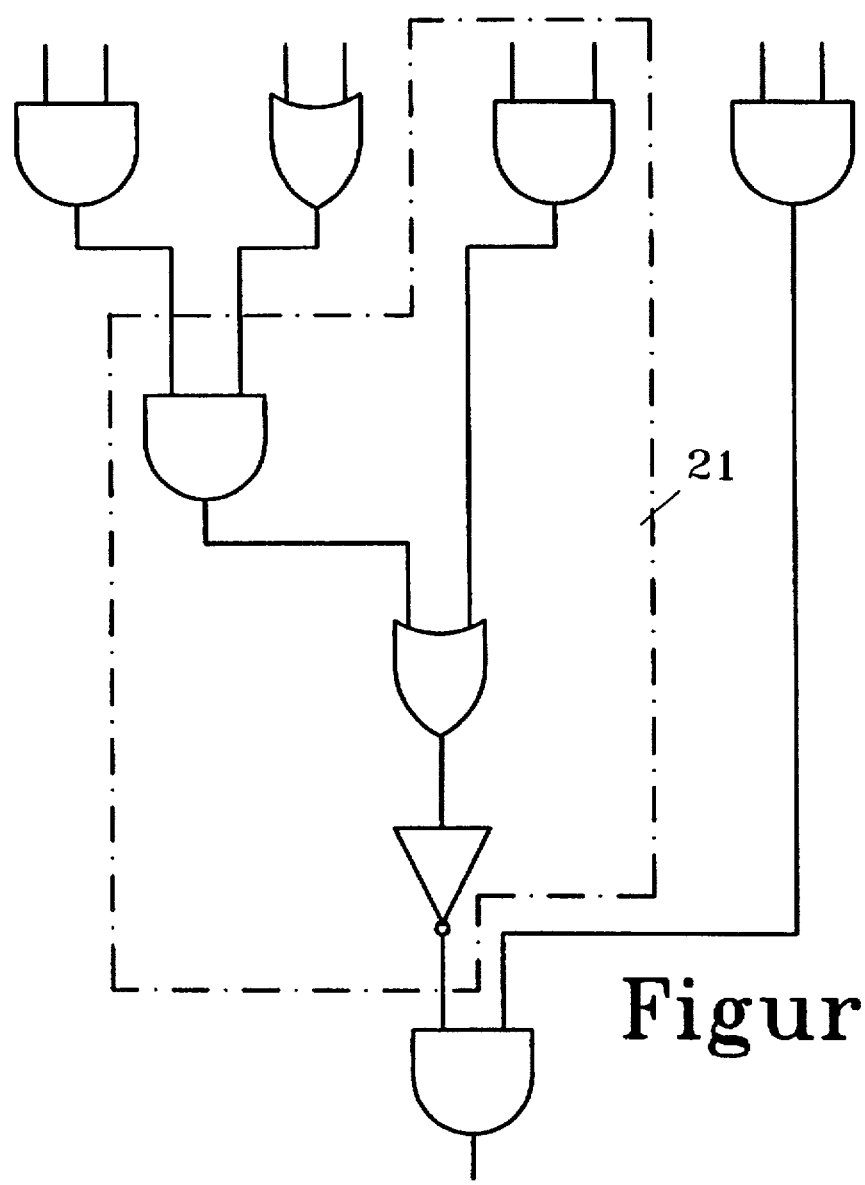
FIGS. 2A and 2B illustrate how a set of gates in a reduced tree can be replaced by a tile corresponding to a cell from the cell library.
Figure 2B:
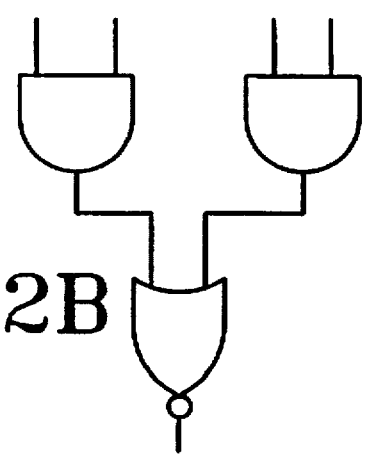
Figure 3A:
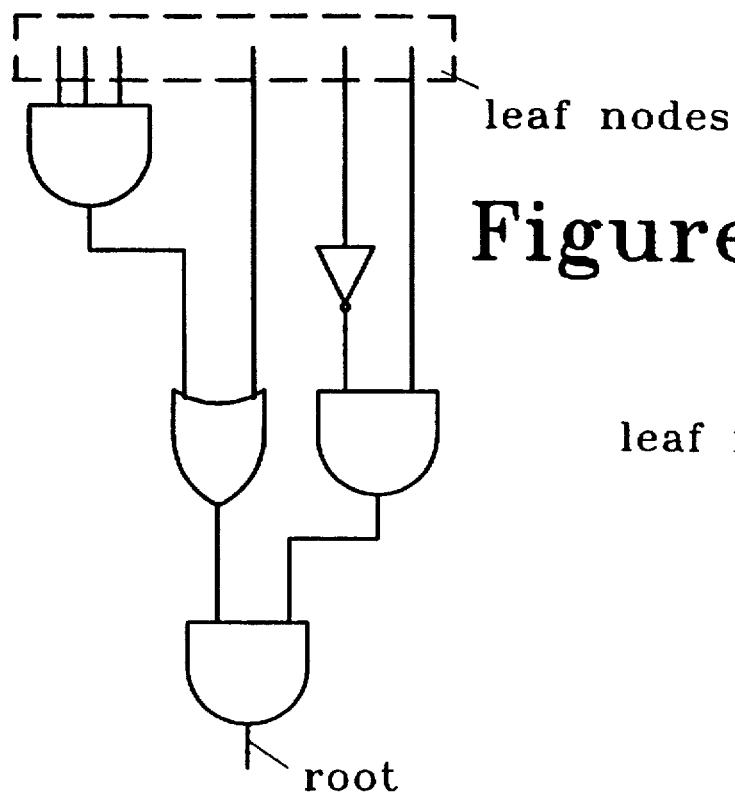
FIGS. 3A–3C are three examples of trees.
Figure 3B:
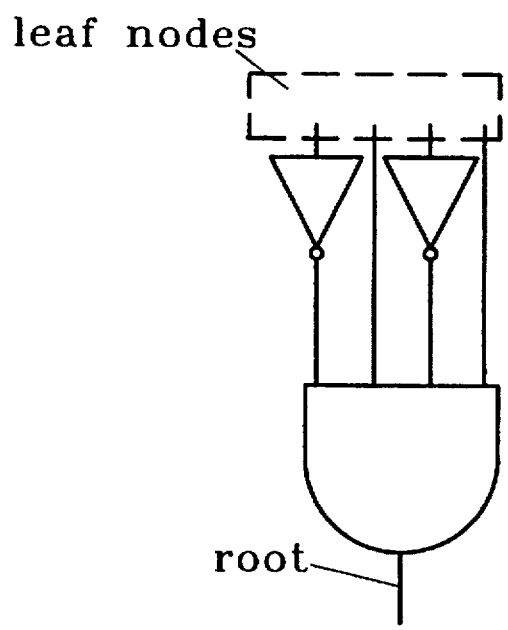
Figure 3C:
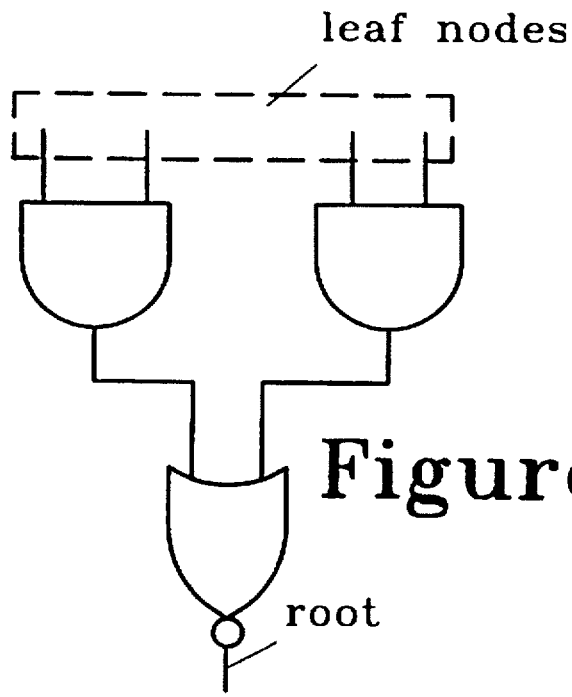
Figure 4A:
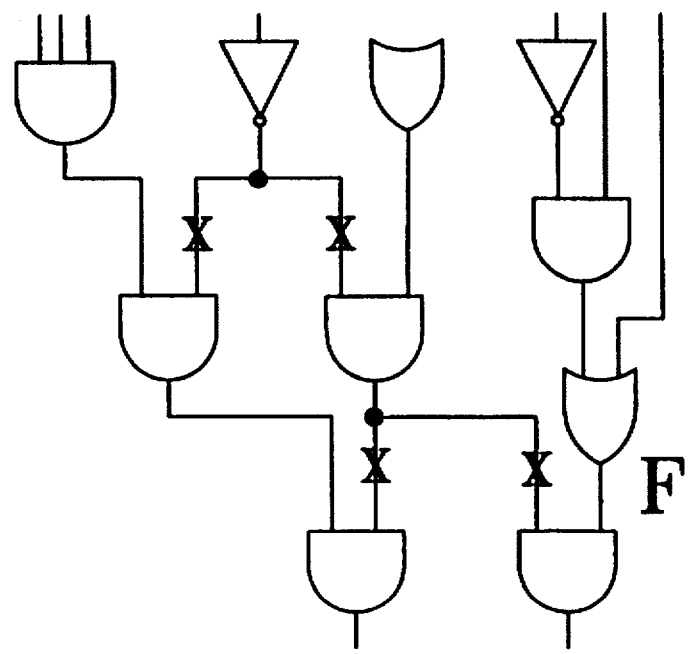
FIGS. 4A and 4B illustrate the decomposition of a DAG into trees by deleting all of the outgoing edges of the fanout nodes.
Figure 4B:
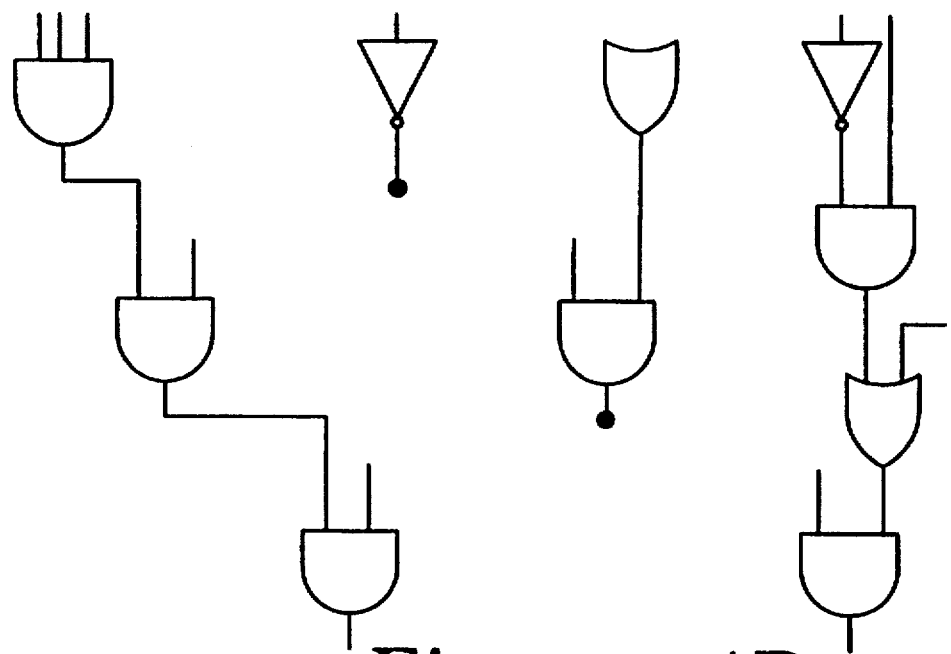
Figure 5A:
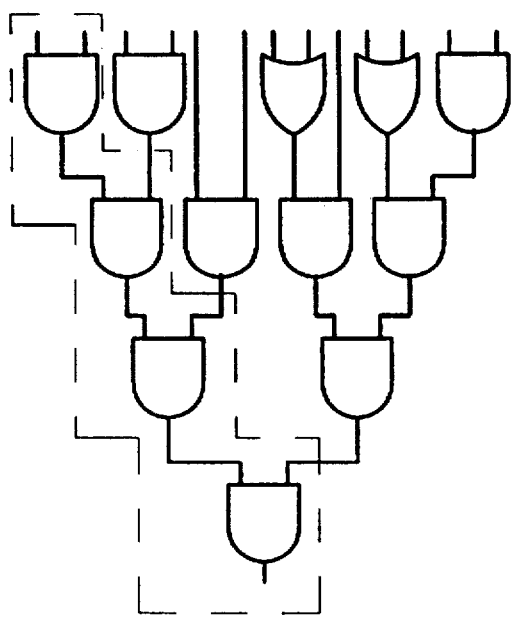
FIGS. 5A–5D illustrates a circuit in which there are four and only four different ways to map a 5-input AND gate at the root node of that tree.
Figure 5B:
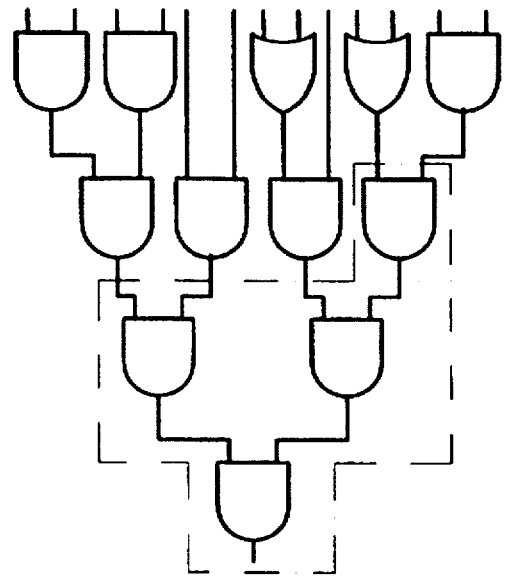
Figure 5C:
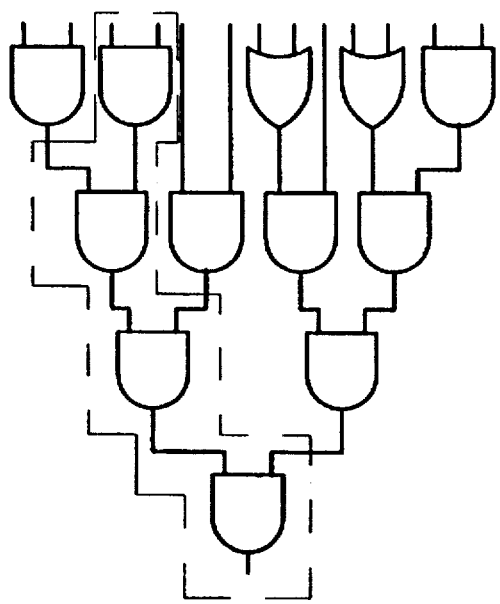
Figure 5D:
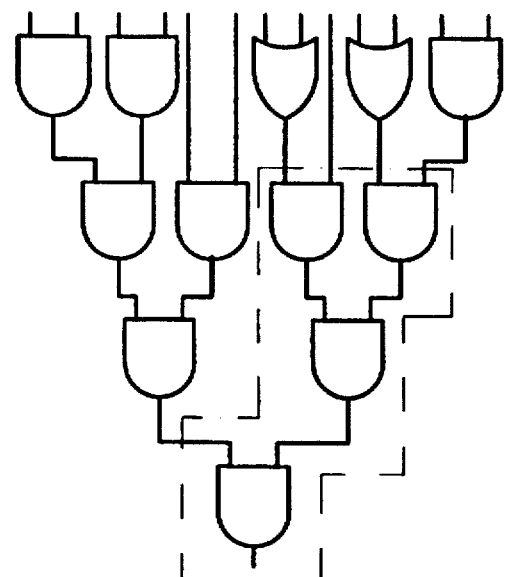

As in the Basic Node Tiling Procedure: (1) the circuit is represented as a directed acyclic graph (DAG) that is then decomposed into trees; (2) each tree is converted into a reduced tree, consisting only of INVERTERs, 2-input AND gates and 2-input OR gates; (3) the nodes of each tree are listed in a levelized input-to-output order; (4) an optimization of the circuit is produced using the above-mentioned cell library for that technology; and (5) a new net list is produced for the optimized circuit. In step (2), the reduced tree can be in terms only of 2-input AND gates, 2-input OR gates and INVERTERs. All that is needed is that a canonical form be produced that can be quickly and efficiently compared with analogous canonical forms of the cells in the cell library. It is primarily in step (4) that the present procedure differs from the Basic procedure.

In the examples and discussion presented herein, the conversion in step (2) will be in terms of INVERTERs, 2-input AND gates and 2-input OR gates. Alternate embodiments that utilize other sets of gates in this conversion, such as a set consisting of INVERTERs and 2-input NAND gates, can be accomodated by straightforward modifications of the present examples.

In step (4), the reduced tree is scanned in a levelized input-to-output order. At each node, the Basic Node Tiling Procedure is applied to the circuit using only the complex cells in the cell library to identify an optimal cell that can be used to tile that node. By "tiling a node" is meant that the tree rooted at that node that can be replaced by the optimal cell is indeed replaced by that optimal cell. In addition, the primary cost for the cell at that node and the k-cost, for each of the values of k from 2 to $N_{MAX}$ are calculated for this node, where $N_{MAX}$ is the maximum number of inputs of any AND, OR, NAND or NOR cell in the library. It is the primary cost and k-cost factors that enable an optimization of these trees without the need for the pattern matching of the Basic Node Tiling Procedure. These k-costs and the cost of the k-input basic cell of the same type as the existing cell at that node are used to identify the optimal basic cell that can be utilized at that node.

The k-cost of a node represents the cost of expressing that node as the AND or OR of k earlier nodes in the tree, but without including any cost for the k-input AND or OR gate itself. Thus, the k-cost represents the cost of getting k different input signals to that node, but does not include the cost of the gate at that node. For k>1, the k-cost of the Gth node in the levelized list, is denoted by "cost(G,k)".

Whenever k is greater than the number of input nodes of that tree that are connected to the node for which this calculation is being performed, the k-cost can be set equal to infinity. Because the optimization process minimizes cost, the optimized circuit will not include any trees having an infinite cost. Thus, setting a k-cost equal to infinity ensures that such an option will not be used. However, in the preferred embodiment, the range of k values is limited at each stage of the technology mapping procedure such that these situations are not encountered.

Although one embodiment of this invention utilizes a library having only INVERTERS, AND gates and OR gates, the preferred embodiment includes AND gates, NAND gates OR gates, NOR gates and INVERTERs and may include some complex cells (e.g., an AND-or-INVERT gate). In this embodiment, at each node, in addition to calculating the k-costs, for k=2, . . . ,$N_{MAX}$, the cost of producing the inverted output at that node for a tree having k inputs, for each value of k from 2 to $N_{MAX}$ is calculated. This cost for such a node G is referred to herein as the "costCOMP(G,k)", where "COMP" indicates that this is the cost of the complemented signal at that node. For each of the nodes G, in addition to calculating and storing the cost(G,k) (i.e., k-cost) values and the costCOMP(G,k) values, for each value of n and k, a number, referred to as the "partition(G,k)" is determined and stored. This number indicates, for a given value of k, how many of these k inputs are drawn from the right tree connected to the 2-input (AND or OR) gate at the Gth node of the reduced tree. These additional numbers decrease the amount of time needed to reconstruct the set of gates in the reduced tree that will be replaced by the optimal cell to be tiled at this node.

The meaning of k-cost can be illustrated by the following example based on the simple circuit illustrated in FIG. 6 and the use of area as the cost factor. For the case of k=3, the only two ways to express the node G as a 3-input AND of earlier nodes in the tree are: G=AND(A, B, F) or G=AND(E, C, D).

In accordance with the above definition of k-cost, the 3-cost of node G is:

$$\text{cost}(G,3) = \text{lesser of} \begin{cases} \text{cost}(A,1) + \text{cost}(B,1) + \text{cost}(F,1) \\ \text{and} \\ \text{cost}(E,1) + \text{cost}(C,1) + \text{cost}(D,1) \end{cases} \quad (1)$$

Similarly, the 2-cost of nodes E and F are:

$$\text{cost}(E,2) = \text{cost}(A,1) + \text{cost}(B,1) \quad (2)$$

$$\text{cost}(F,2) = \text{cost}(C,1) + \text{cost}(D,1) \quad (3)$$

By substituting equations (2) and (3) into the equation (1), it can be seen that:

$$\text{cost}(G,3) = \text{the lesser of} \begin{cases} \text{cost}(E,2) + \text{cost}(F,1) \\ \text{and} \\ \text{cost}(E,1) + \text{cost}(F,2) \end{cases} \quad (4)$$

The advantage of this latter formulation is that it expresses the 3-cost of G in terms of the nodes immediately above G in the tree and because it generalizes to larger values of k. For example, for k=4, it can be seen that the 4-cost of G is the minimum of the following expressions:

$$\text{cost}(G,4) = \text{the least of} \begin{cases} \text{cost}(E,3) + \text{cost}(F,1) \\ \text{cost}(E,2) + \text{cost}(F,2) \\ \text{cost}(E,1) + \text{cost}(F,3) \end{cases} \quad (5)$$

The first of these expressions represents the cost of realizing G as the AND of three nodes from the left subtree and one node from the right subtree and therefore exhibits a partition value of (3,1) for that node. The second of these expressions represents the cost of realizing G as the AND of two nodes from the left subtree and two nodes from the right subtree and therefore exhibits a partition value of (2,2) for that node. The third of these expressions represents the cost of realizing G as the AND of one node from the left subtree and three nodes from the right subtree and therefore exhibits a partition value of (1,3) for that node. Together, these three possibilities represent all possible ways of realizing G as a 4 input AND gate.

This result can be represented generally, for a node G and for k>2, as:

$$\text{cost}(G,k) = \text{MIN}\{\text{cost}(E,i) + \text{cost}(F,j)\} \quad (6)$$
$$i+j=k$$

In this equation, the minimum is taken over all pairs of integers (i,j) whose sum is k. This relationship provides an efficient way to compute the k-cost of any node. Furthermore, once all of the k-costs have been calculated for k=2, . . . ,$N_{MAX}$, the primary cost of node G can be easily computed as:

$$\text{cost}(G,1) = \text{MIN}\{k\text{-cost}(G) + \text{area}(\text{AND},k)\} \quad (7)$$
$$k=2, \ldots, N_{MAX}$$

where the term "area(AND,k)" equals the area of the smallest k-input AND gate in the library.

Although this example has been for the case of area as the cost factor and the case of an AND node, the cases for other cost factors and for an OR node are completely analogous, as will be seen in the exemplary detailed embodiments presented in the Description of the Preferred Embodiments. However, for the case in which the maximum time for transmission of a signal through the circuit is the measure of cost, equation (6) is replaced by $$\text{cost}(G,k) = \underset{i+j=k}{\text{MIN}} \{\text{MAX}\{\text{cost}(E,i), \text{cost}(F,j)\}\} \quad (6')$$

where MAX{cost(E,i), cost(F,j)} is equal to the larger of cost(E,i) and cost(F,j) and represents the time of arrival of the last to arrive of the signal via node E and the signal via node F. In this equation, the minimum is taken over all pairs of integers $(i,j)$ whose sum is k so that cost(G,k) is the shortest time to produce a signal at node G in response to k input signals. Similarly, equation (7) is modified to be:

$$\text{cost}(G,1) = MIN\{\text{cost}(G,k) + \text{delay}(AND,k)\} \quad (7')$$

$$k=2, \ldots N_{MAX}$$

where delay(AND,k) is the maximum time for any input signal to travel through the fastest k-input AND gate in the library.

Figure 7B:
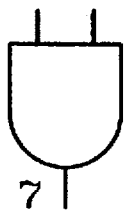
FIG. 7B is the cell library used in the optimization of the circuit of FIG. 7A.
Figure 7B:
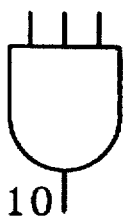
Figure 7B:
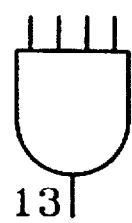
Figure 7B:
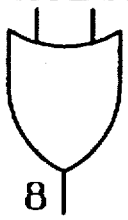
Figure 7B:
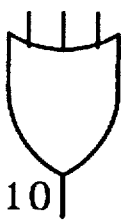
Figure 7B:
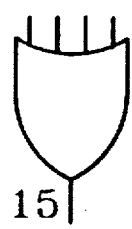
Figure 7B:
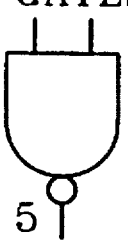
Figure 7B:
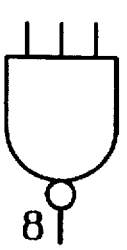
Figure 7B:
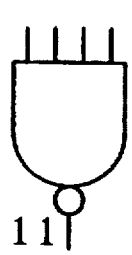
Figure 7B:
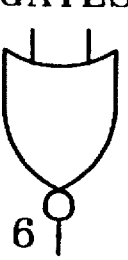
Figure 7B:
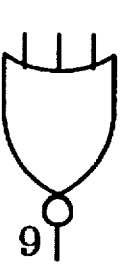
Figure 7B:
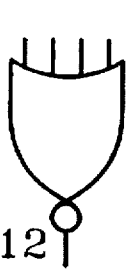
Figure 7B:
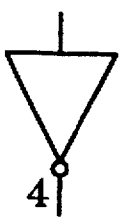

It should be noted that every tile can cover only gates of the same type. That is, if the gate at the root node is an AND gate, then the search for the optimal tile can extend only to those gates that are themselves AND gates and such AND gates must each be connected to the root node through a sequence of AND gates. An analogous statement is true for OR gates. In one class of embodiments, all representations are in terms of only three different types of cells: (i) an INVERTER; (ii) an AND gate; and (iii) an OR gate. A reduced tree that is representative of this class is illustrated in FIG. 7A and a cell library to be used in implementing this circuit is presented in FIG. 7B. The numerical values produced during the optimization process are presented in FIG. 7C. This class is primarily useful for illustrating this invention, because, in most applications, the library will include AND gates, NAND gates, OR gates, NOR gates and INVERTERs as well as some complex gates. This example is also simplified in that it assumes that none of the leaf nodes is an inverting INPUT.

Because data at nodes, other than the INPUT nodes, are determined by data at other nodes within the circuit being designed, it is necessary that the data structure describing the circuit include information that specifies the interconnection of the nodes of the circuit. Any particular gate in the reduced tree is considered to be at node G if it has its output connected to node G. In the present data structure, the interconnection data is stored for the reduced tree in the form of the data vectors "left(G)" and "right(G)" where, for a 2-input gate at node G, its left input is connected to the node identified by left(G) and its right input is connected to the node identified by right(G). The values of the components of these vectors are:

$$\text{left}(G) = \begin{cases} \text{node number of the left input of the gate that outputs } G & (8) \\ 0 \text{ if } G \text{ is an input node} \end{cases}$$

$$\text{right}(G) = \begin{cases} \text{node number of the right input of the gate that outputs } G \\ 0 \text{ if } G \text{ is an input node} \end{cases} \quad (9)$$

Because only clusters of gates of the same type can be replaced by a library cell of the same type, it is necessary to identify the type (i.e., AND, OR, or INVERTER) for each gate in the reduced tree. Therefore, the data structure includes the data vector "nodetype(G)" that, for each value of n, identifies the gate type for the gate at node G. The values of the components of this vector are:

$$\text{nodetype}(G) = \begin{cases} \text{AND} & \text{if } G \text{ is the output of an AND gate in the tree} \\ \text{OR} & \text{if } G \text{ is the output of an OR gate in the tree} \\ \text{INPUT} & \text{if } G \text{ is an input (leaf) node of the tree} \end{cases} \quad (10)$$

In many cases, the number of components of a vector that are actually used is a function of the node to which its associated gate is attached. An example of this is the partition matrix p(G,k), which indicates for a node G how many of its k inputs arrive through the right input (i.e., its input connected to right(G)) of that 2-input gate. Another example of this is the calculation of cost(G,k) in equation (6) above. The range of k values that are possible is dependent on the particular node G. In addition, in the calculation, the values of i and j are not only restricted by the limitation that i+j=k, but are also restricted by separate limitations on the values of i and j, where i and j represent the number of inputs that arrive to the gate at node G through its left and right inputs, respectively. For example, for a gate having its left input connected to an INPUT of the circuit, i can only assume the value of 1. Thus, in general, the values of i and j are each equal to or less than an associated maximum value "$w_{MAX}(G)$" for that gate, represented as "$i_{MAX}$" and "$j_{max}$", respectively. Therefore, the vector $w_{MAX}(G)$ is also stored which indicates the maximum number of input signals that can affect the signal value on node G.

The computation for this circuit has the following steps:
1. Input limitations for nodes:

For each INPUT node G, only a single input signal can be applied to that node. This is represented by the requirement that the maximum number, $W_{MAX}(G)$, of an input node G is one (i.e., $w_{MAX}(G)=1$).

For each noninput node G, in levelized input-to output order, compute:

$$i_{MAX} = \quad (11)$$

$$\begin{cases} \text{MIN}\{w_{MAX}(\text{left}(G)), N_{MAX} - 1\} & \text{if nodetype}(\text{left}(G)) = \text{nodetype}(G) \\ 1 & \text{otherwise} \end{cases}$$

and $$j_{MAX} = \quad (12)$$

$$\begin{cases} \text{MIN}\{w_{MAX}(\text{right}(G)), N_{MAX} - 1\} & \text{if nodetype}(\text{right}(G)) = \text{nodetype}(G) \\ 1 & \text{otherwise} \end{cases}$$

where $N_{MAX}$ is the maximum number of inputs of any AND or OR in the cell library. In the following exemplary embodiment, the cell library includes AND, OR, NAND, NOR and INVERTER cells. For such embodiments, $N_{MAX}$ is the maximum number of inputs of any AND, OR, NOR, or NAND cell in the cell library.

2. Cost calculations:

For each input node, if the cost is in terms of area, then the cost of an input node is zero and, if the cost is in terms of maximum signal delay, then the cost of an input node is the expected maximum delay for the input signal to that node to reach that input node. This is expressed as:

$$\text{cost}(G,1) = \begin{cases} 0 \text{ if cost is area} \\ \text{arrival time of signal at node } G \text{ if cost is time} \end{cases} \quad (13)$$

For each node that is not an input node, the cost is calculated as:

if cost is area, then the cost at node G of receiving i inputs through a left input node at node number left(G) and j inputs through a right input node at node number right(G) is denoted as (G,i,j) and is equal to:

if cost is area, then $$(G,i,j) = \text{cost}(\text{left}(G),i) + \text{cost}(\text{right}(G),j) \quad (14)$$

if cost is time, then $$a(G,i,j) = \text{MAX}\{\text{cost}(\text{left}(G),i), \text{cost}(\text{right}(G),j)\} \quad (15)$$

where $i=1, \ldots, i_{MAX}$ and $j=1, \ldots, \text{MIN}\{j_{MAX}, w_{MAX}(G)-i\}$.

Because this procedure is designed to minimize the cost of a circuit, all of the choices of how many of the input signals affecting the signal on node G arrive through the left input of the gate at node G and how many arrive through the right input are scanned to determine which of these choices minimizes the cost at node G. This is expressed as:

$$\text{cost}(G,k) = \text{MIN}\{a(G,i,j)\} \text{ subject to } i+j=k, i=1, \ldots i_{MAX} \text{ and } j=1, \ldots w_{MAX} \quad (16)$$

where $k=2, \ldots, w_{MAX}(G)$. The partition(G,k) indicates the value of i that produces the minimum for cost(G,k) and therefore indicates how many of the k inputs are to reach node G through the left input of the gate at node G.

The total cost, denoted as cost(G,1), for a signal to be produced at node G is the cost for the input signals for the gate at node G to reach that gate plus the additional cost of that gate itself. The cost of a k-input AND gate is denoted as "c(AND,k)", the cost of a k-input OR gate is denoted as "c(OR,k)" and the cost of the k-input gate employed at node G as part of the process of calculating the minimum cost of producing a signal at node G is represented as "c(nodetype(G),k)". This total cost is then minimized as a function of the number of inputs that there are for that gate. That is, $$\text{cost}(G,1) = \text{MIN}\{\text{cost}(G,k) + c(\text{nodetype}(G),k)\} \quad (17)$$

$k=2, \ldots w_{MAX}(G)$

This minimized cost is therefore the least cost for producing the signal at node G. The gate type for the tile that can be tiled at that node G is the same as the gate type of gate at that node in the initial reduced tree. The number of input nodes for that tile is equal to the value of k that minimized cost(G,1). The gate type for the tile is stored as "tiletype(G)".

Figure 8A:
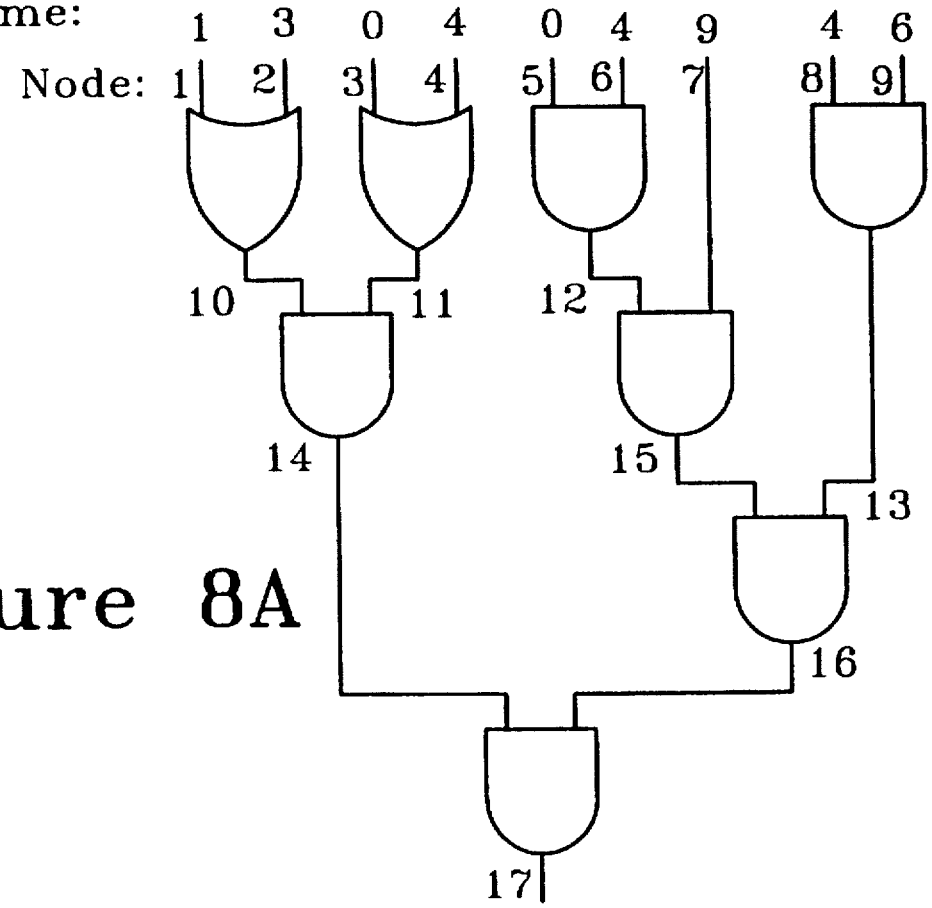
FIG. 8A illustrates a tiling of the circuit of FIG. 7A using a library having only AND gates, OR gates and INVERTERs.
Figure 8B:
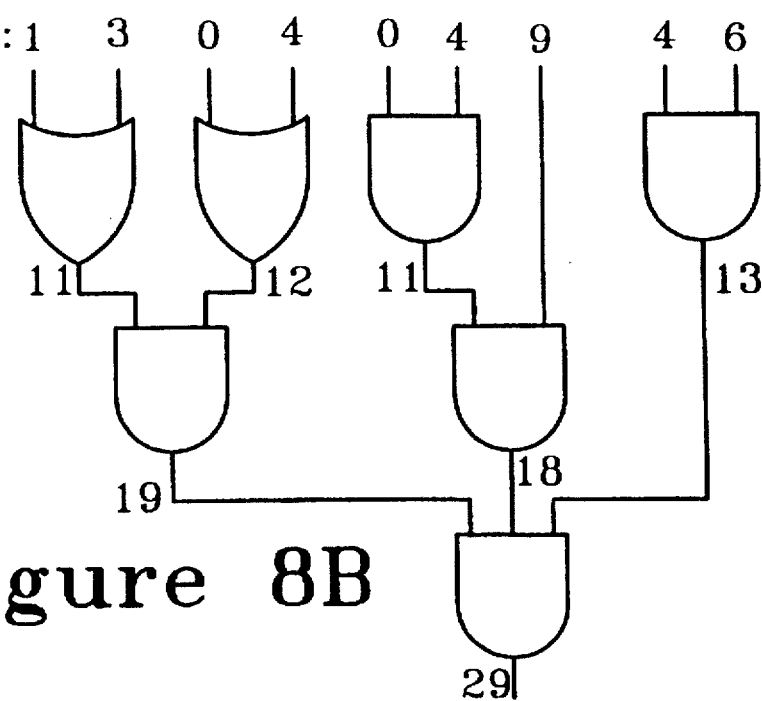
FIG. 8B illustrates the gate-level circuit resulting from the tiling of FIG. 8A and presenting the resulting costs for the case of arrival times as the measure of cost.

For the circuit of FIG. 7A and associated cell library of FIG. 7B, the numerical values produced by this optimization procedure are presented in the FIG. 7C. FIG. 8A illustrates the resulting tiling of the circuit of FIG. 7A using a library having only AND gates, OR gates and INVERTERs and FIG. 8B illustrates the gate-level circuit resulting from the tiling of FIG. 8A. FIG. 8B also presents the resulting costs for the case of arrival times as the measure of cost. Appendix A summarizes the steps of the optimization procedure illustrated in FIGS. 7A–7C.

In the above embodiment, the library and the representations of the reduced tree both contain only AND gates, OR gates and INVERTERs. In another class of embodiments, it is the library that contains only these three different types of cells. In the preferred embodiment, the representations contain only AND gates, OR gates and INVERTERs, but the library includes AND gates, OR gates, NAND gates, NOR gates and INVERTERS. An example illustrating this preferred embodiment is presented in FIGS. 9A–9F.

Figure 9A:
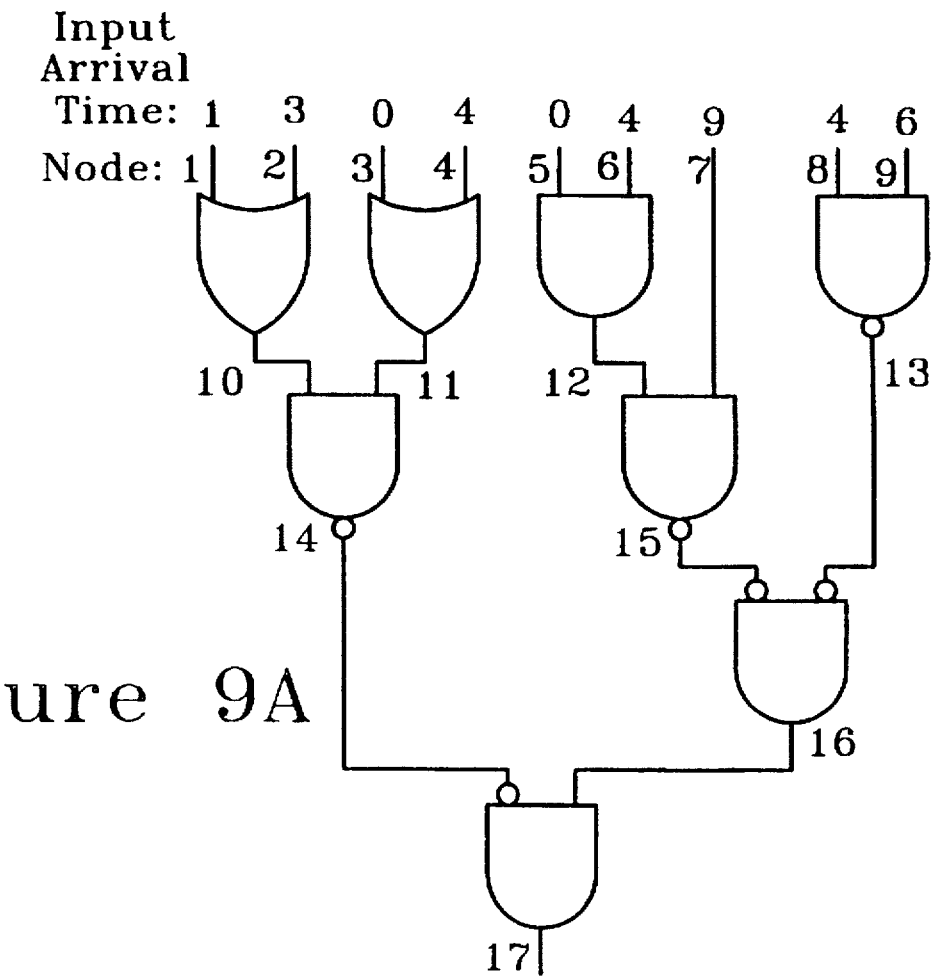
FIG. 9A illustrates a tiling of the circuit of FIG. 7A using a library having AND gates, OR gates, NAND gates, NOR gates and INVERTERs.
Figure 9B:
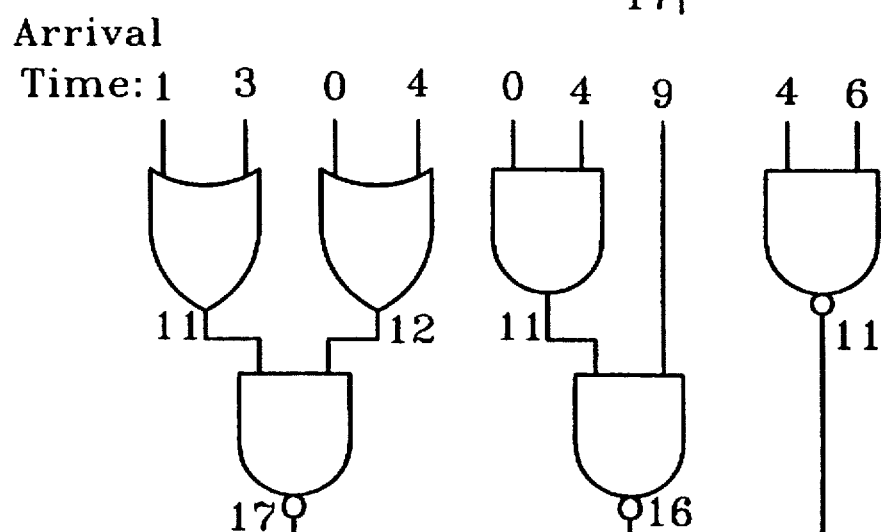
FIG. 9B illustrates the gate-level circuit resulting from the tiling of FIG. 9A and presenting the resulting costs for the case of arrival times as the measure of cost.

FIG. 9A illustrates a tiling of the circuit of FIG. 7A using a library having AND gates, OR gates, NAND gates, NOR gates and INVERTERs. FIG. 9B illustrates the gate-level circuit resulting from the tiling of FIG. 9A and presenting the resulting costs for the case of arrival times as the measure of cost. FIGS. 9C–9F present the numerical values produced during the optimization procedure of the circuit of FIG. 9A, using the library of FIG. 7B.

In addition to the data structures used for the embodiment illustrated in FIGS. 7A–7C, 8A and 8B, this preferred embodiment utilizes the following additional data structures. For each node G, in addition to determining and storing nodetype(G), left(G) and right(G), the vector "inverted(G)" is stored and is defined as:

$$\text{inverted}(G) = \begin{cases} 1 \text{ if input } G \text{ is marked as inverted} \\ 0 \text{ if input } G \text{ is not marked as inverted} \end{cases} \quad (18)$$

In this description, the reduced tree does not contain any INVERTER nodes. Instead, any inverter that was present on a tree leaf node has been removed and replaced by an "inverted" flag on the leaf node. This inverted flag has the form of a circle between the input and the gate at which this signal inversion occurs.

In the computations, in addition to calculating cost(G,k), a(G,i,j), partition(G,k), nodetype(G), c(nodetype(G),k) and tiletype(G), the following analogous computations are made for nodes at which the signal is inverted: costCOMP(G,1), costCOMP(G,k) for k>1, aCOMP(G,i,j), partitionCOMP(G, k), tiletypeCOMP(G) and tilewidthCOMP(G).

Thus, (a) costCOMP(G,1) is the cost of producing, at a node G, the complement of the signal at node G.

(b) costCOMP(G,k) for k>1, is the minimum cost of getting the complements of k different signals to node G from gates of the same type (i.e., AND-type or OR-type) as the gate at node G, but does not include the cost of the gate at node G.

(c) if cost is area, then $$\text{aCOMP}(G,i,j) = \text{costCOMP}(\text{left}(G),i) + \text{costCOMP}(\text{right}(G),j) \quad (14')$$

if cost is time, then $$\text{aCOMP}(G,i,j) = \text{MAX}\{\text{costCOMP}(\text{left}(G),i), \text{costCOMP}(\text{right}(G),j)\}$$

where $i=1, \ldots, i_{MAX}$ and $j=1, \ldots, \text{MIN}\{j_{MAX},$ (d) partitionCOMP(G,k) indicates, for a given value of k, how many of these k inputs are drawn from the right tree connected to the 2-input (AND or OR) gate at the Gth node of the reduced tree.

(e) tiletypeCOMP(G) and tilewidthCOMP(G) are the type (i.e., AND, OR, NAND or NOR) and number of inputs of the optimal cell for producing the component of the signal at node G.

There are many possible variations, such as the following three variations, that can be implemented on the above exemplary embodiments.

A. In Step 2(a), a list of tree nodes was constructed in levelized order. The purpose of this is to enable the tiling computation to be done in a levelized order. It is the levelized order of computation that is important, not the manner in which this is achieved. Explicit construction of a levelized list is not the only way to ensure this. For example, as described in the paper by Kreutzer, et al, this levelized order of tiling computation is achieved by use of a depth-first search of the tree, starting at the root node of the tree. During this search, each node is tiled only after all deeper nodes have been tiled. This method avoids constructing a levelized list and, in effect, generates a levelized ordering "on the fly".

B. It is not necessary to perform the optimization on one tree at a time. The above examples process a tree at a time, because this reflects the logical structure of the optimization (i.e., tiles do not overlap tree boundaries) and because there are certain advantages to doing so (such as the potential for reducing memory requirements by freeing memory locations used for each tree after that tree has been tiled). Nevertheless, one could also tile the nodes according to the levelized ordering of the entire DAG, modifying the tiling algorithm so that all storage variables are reset upon encountering a fanout node, in the same manner as they would be at the leaf of a tree. This approach also allows for additional timing optimization by means of limited overlap of tiles across tree boundaries, as described in the following paragraphs excerpted from page 117 of the article by Ewald Detjeus et al entitled Technology Mapping in MIS, ICCAD, 1987, p. 116–119:

"Another approach to DAG partitioning was tried. Instead of making each multiple fanout node a root of a tree, only primary outputs of the network are used as roots. The mapping starts at a primary output, and continues until either a primary input is encountered, or until another internal node that already has been mapped is encountered. If a node has already been mapped, either it is the output of an existing cell or is a node internal to a cell. If the node is the output of a cell, then it is treated as a leaf cell. If the node is internal to a cell, the algorithm continues mapping until it reaches the input nodes to that existing cell. Some logic may be duplicated where the mapping overlaps.

To reduce the number of logic levels on the critical paths, outputs of the network are ordered by their slacks. Priority is given to the first output, which is then mapped without interruption all the way to it inputs. Other outputs have less chance to get an optimal mapping to the inputs, because part of the network is already mapped".

C. There is also some latitude as to when the step of decomposing wide AND and OR gates into 2-input AND and 2-input OR gates is done. In the above examples, this occurred during Step 2(b)—that is, all AND and OR gates in a given tree are decomposed at the same time. An alternate approach is to to do this decomposition on a demand-driven basis. By this is meant that AND and OR gates are only decomposed when optimal tiles have been computed for all of the input nodes for such AND and OR gates. The advantage of this demand-driven decomposition is that the decomposition of each gate can utilize the actual arrival times of the input nodes of the gate, based on the optimal tiling of those input nodes.

Appendix B summarizes the steps of the optimization procedure illustrated in FIGS. 9A–9F.

FIGS. 10A–10E illustrate an improved method of decomposing a wide gate to produce a reduced circuit implementation of the gates, wherein cost is measured by the time of arrival of signals and wherein the times of arrival of the input signals for this gate are known. This example assumes that all of the 2-input AND gates in these five figures have the same nominal delay of 5. In accordance with this method of decomposition, at each step, those two inputs are broken off to a separate 2-input AND gate that exhibit the shortest delay at that stage of the decomposition. Thus, as illustrated in FIG. 10B, for the initial 6-input gate 1001, the two inputs exhibiting the least delay (i.e., the inputs with delays of 0 and 3) are split off as inputs of a 2-input AND gate 1002 and the output of this gate as well as the remaining inputs are applied to 5-input AND gate 1003. The resulting 5-input AND gate 1003 is then decomposed as illustrated in FIG. 10C, so that its two inputs exhibiting the least delay (i.e., the inputs with delays of 6 and 8) are split off as inputs of a 2-input AND gate 1004, which has its output coupled to a 4-input AND gate 1005.

Because the output of 2-input AND gate 1002 is one of the two inputs having the least delay to AND gate 1003, gate 1004 is aligned in series with gates 1002 and 1005. However, this pattern is broken at the next step of decomposition as illustrated in FIGS. 10C and 10D. The two inputs to AND gate 1005 having the least delay are both original inputs of AND gate 1001. Because of this, after the decomposition, the resulting circuit, illustrated in FIG. 10D, includes a new 2-input AND gate 1006 which is coupled to the 3-input AND gate in parallel with 2-input AND gate 1004.

As can be seen from FIGS. 10D and 10E, the last step in this decomposition results in an additional pair of AND gates 1008 and 1009 in series with gates 1002 and 1004. The advantage of this decomposition method is that it produces a canonical decomposition as a reduced circuit having a minimal total delay of the output signal. The resulting output signal from this cluster of gates exhibits a delay of 24. In contrast to this, the worst case decomposition occurs if, at each successive decomposition step, the input with the longest delay is paired with the input having the least delay. The result of this decomposition, illustrated in FIG. 10F, exhibits an output signal having a delay of 39. This is the worst case delay because, it produces a decomposed structure having a maximum number of levels of gates (i.e., the number of levels is one less than the number of original INPUTs), thereby maximizing the amount of delay introduced by the gates, and includes at the input of this series structure of AND gates the INPUT having the maximum amount of initial delay in rippling signals through this gate structure. Completely analogous worst case and best case decompositions of a 6-input OR gate are produced by replacing all AND gates in FIGS. 10A–10F with OR gates.

---

Appendix A
First Exemplary Embodiment:
Tiling Computation Using AND and OR Gates Only

---

This is a simplified version of the tiling algorithm, which assumes that the library consists of AND and OR gates only, and that none of the leaf nodes of the binary tree is inverted. This simplified algorithm is for expository purposes only. It is not realistic, because real circuits almost without exception involve inverted signals, and any real library will contain inverting gates.
For each node x of the binary tree, the following are given:

nodetype(x)  =  AND   if x is the output of an AND gate in the tree
                          OR    if x is the output of an OR gate in the tree
                          INPUT if x is an input (leaf) node of the tree
    left(x)        =  node number of left input node of the gate that outputs x
                 =  0 if x is an input node

Appendix A
First Exemplary Embodiment:
Tiling Computation Using AND and OR Gates Only

```
right(x)      =   node number of right input node of the gate that outputs x
              =   0 if x is an input node
```
The computation has the following steps:
1. For each input node x:
   wMax (x) = 1
   if cost is area
      cost (x,1)   = 0
   if cost is time
      cost (x,1)   = arrival time of signal x
2. For each noninput node x, in levelized input-to-output order, compute:
   ```
   iMax   = min { wMax(left(x)), kMax-1 }   if nodetype(left(x)) = nodetype(x)
          = 1                                otherwise
   jMax   = min { wMax(right(x)), kMax-1 }  if nodetype(right(x)) = nodetype(x)
          = 1                                otherwise
   wMax (x) = min { iMax+jMax, kMax }
   ```
   where kMax is the maximum number of inputs of any AND, OR, NAND or NOR gate in the library.
   for each i = 1, . . . ,iMax and each j = i, . . . ,min{ jMax, wMax(x)−i }
      if cost is area
         a(i,j) = cost(left(x),i) + cost(right(x),j)
      if cost is time
         a(i,j) = max { cost(left(x),i), cost(right(x),j) }
   for n = 2, . . . ,wMax(x):
      cost(x,n)      = min { a(i,j) : i+j=n, i=1, . . . ,iMax, j=1, . . . ,jMax }
      partition(x,n) = value of i that gave the minimum for cost(x,n)
      if nodetype(x)=AND
         d(AND,n) = cost(x,n) + c(AND,n)
            where c(t,n) is the cost of an n-input gate of type t
      if nodetype(x)=OR
         d(OR,n) = cost(x,n) + c(OR,n)
   if nodetype(x)=AND
      cost(x,1)      = min { d(AND,n) : n=2, . . . ,wMax(x) }
   if nodetype(x)=OR
      cost(x,1)      = min { d(OR,n) : n=2, . . . ,wMax(x) }
   tiletype(x)    = type of gate (AND,OR) that gave minimum for cost(x,1)
   tilewidth(x)   = value of n that gave minimum for cost(x,1)

Appendix B
Second Exemplary Embodiment
Tiling Computation Using Full Library For each node x of the binary tree, the following are given:
```
nodetype(x)  =   AND    if x is the output of an AND gate in the tree
                 OR     if x is the output of an OR gate in the tree
                 INPUT  if x is an input (leaf) node of the tree
left(x)      =   node number of left input node of the gate that outputs x
             =   0 if x is an input node
right(x)     =   node number of right input node of the gate that outputs x
             =   0 if x is an input node
inverted(x)  =   1 if input x is marked as inverted
             =   0 if input x is not marked as inverted
```
In this description, the binary tree does not contain any INVERT-nodes. Rather, any inverter that was present on a tree leaf node has been removed and replaced by an "inverted" flag on the leaf node.
The computation has the following steps:
1. For each input node x:
   wMax(x) = 1
   if inverted(x) = 0
      if cost is area
         cost(x,1)       = 0
         costComp(x,1)   = area cost of making the complement of x available
      if cost is time
         cost(x,1)       = arrival time of signal x
         costComp(x,1)   = time when complement of signal x can be made available
   if inverted(x) = 1
      if cost is area
         cost(x,1)       = area cost of making the complement of x available
         costComp(x,1)   = 0
      if cost is time
         cost(x,1)       = time when complement of signal x can be made available
         costComp(x,1)   = arrival time of signal x
2. For each noninput node x, in levelized input-to-output order, compute:
   iMax   =   min { wMax(left(x)), kMax-1 }   if nodetype(left(x)) = nodetype(x)

-continued

Appendix B
Second Exemplary Embodiment
Tiling Computation Using Full Library

```
            =  1                              otherwise
jMax     =  min { wMax(right(x)), kMax-1 }   if nodetype(right(x)) = nodetype(x)
         =  1                                otherwise
wMax(x) = min { iMax+jMax, kMax }
for each i = 1, . . . ,iMax and each j = 1, . . . ,min{ jMax, wMax(x)-i }
    if cost is area
        a (i,j)    =  cost(left(x),i) + cost(right(x),j)
        b (i,j)    =  costComp(left(x),i) + costComp(right(x),j)
    if cost is time
        a(i,j)     =  max { cost(left)(x),i), cost(right(x),j) }
        b(i,j)     =  max { costComp(left(x),i), costComp(right(x),j) }
for n = 2, . . . ,wMax(x)
    cost(x,n)     = min { a (i,j) : i+j=n, i=1, . . .,iMax, j=i, . . . ,jMax }
    costComp(x,n) = min { b (i,j) : i+j=n, i=1, . . . ,iMax, j=i, . . . ,jMax }
    partition(x,n) = value of i that gave the minimum for cost(x,n)
    partitionComp(x,n) = value of i that gave the minimum for costComp(x,n)
    if nodetype(x)=AND
        d(AND,n) = cost(x,n) + c(AND,n)
        d(NAND,n) = cost(x,n) + c(NAND,n)
        e(OR,n) = costComp(x,n) + c(OR,n)
        e(NOR,n) = costComp(x,n) + c(NOR,n)
            where c(t,n) is the cost of an n-input gate of type t
    if nodetype(x)=OR
        d(OR,n) = cost(x,n) + c(OR,n)
        d(NOR,n) = cost(x,n) + c(NOR,n)
        e(AND,n) = costComp(x,n) + c(AND,n)
        e(NAND,n) = costComp(x,n) + c(NAND,n)
if nodetype(x)=AND
    cost(x,i)      =  min { d(AND,n), e(NOR,n)    : n=2, . . . ,wMax(x) }
    costComp(x,i)  =  min { d(NAND,n), e(OR,n)    : n=2, . . . ,wMax(x) }
if nodetype(x)=OR
    cost(x,i)      =  min { d(OR,n), e(NAND,n)    : n=2, . . . ,wMax(x) }
    costComp(x,i)  =  min { d(NOR,n), e(AND,n)    : n=2, . . . ,wMax(x) }
tiletype(x) = type of gate(AND, OR, NAND, NOR) that gave minimum for cost(x,i)
tilewidth(x) = value of n that gave minimum for cost(x,i)
tiletypeComp(x) = type of gate(AND, OR, NAND, NOR) that gave minimum for costComp(x)
tilewidthComp(x) = value of n that gave minimum for costComp(x,i)
```

We claim:

1. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied and associated input signal and including an OUTPUT node on which is produced an output signal;

(b) decomposing said representation into trees;

(c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for k=1, . . . $N_{MAX}$, where $N_{MAX}$ is the maximum number of inputs of a cell that will be considered for implementing a circuit, where said cost is an area cost, and where, for k>1, cost (G,k) is the minimum cost of getting k different signals to node G from gates of the same type and where cost(G,1) is the minimum cost of implementing a complete subtree rooted at node G, wherein said cost(G,1) for an INPUT node equal to the area of an inverter for each inverting INPUT node and is equal to zero for each non-inverting INPUT node, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G.

2. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees;

(c) representing each tree as a reduced circuit expressed in terms only of gates selected from the class consisting of:

a first gate selected from the set {2-input OR gate, 2-input NOR gate}: a second gate selected from the set {2-input AND gate; 2-input NAND gate}, and an INVERTER; and (d) for each tree, in a levelized input-to-output order, determining a cost(G,k) for each node G and for k=1, . . . $N_{MAX}$, where $N_{MAX}$ is the maximum number of inputs of a cell that will be considered for implementing a circuit, where said cost is an area cost, and where, for k>1, cost (G,k) is the minimum cost of getting k different signals to node G from gates of the same type and where cost(G,1) is the minimum cost of implementing a complete subtree rooted at node G, wherein the cost(G,1) for a non-INPUT node is equal to the area cost of the cell at node G plus the sum of cost(G',1) for all G that are INPUTs of the cell at node G, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G.

3. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees;

(c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G[]k) for each node G and for k=1, ... where $N_{MAX}$ is the maximum number of inputs of a cell that will be considered for implementing a circuit, where said cost is a time cost, and where, for k>1, cost (G,k) is the minimum cost of getting k different signals to node G from gates of the same type and where cost(G,1) is the minimum cost of implementing a complete subtree rooted at node G, wherein said cost(G,1) for an INPUT node is equal to the delay of a signal at that INPUT node, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G.

4. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees;

(c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for k=1, ..., $N_{MAX}$, where $N_{MAX}$ is the maximum number of inputs of a cell that will be considered for implementing a circuit, where said cost is a time cost, and where, for k>1, cost (G,k) is the minimum cost of getting k different signals to node G from gates of the same type and where cost(G,1) is the minimum cost of implementing a complete subtree rooted at node G, wherein said cost(G>1) for a non-INPUT node is equal to the greatest delay of a signal at any of the INPUT's of the cell at node G plus a nominal delay for transmission of a signal through the cell at node G, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G.

5. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees, for said at least one INPUT node, tiling a ROOT node of said combinational logic circuit with a tile that minimizes a cost(G,1) for the root node;

(c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for k=1, ..., $N_{MAX}$, where $N_{MAX}$ is the maximum number of inputs of a cell that wl be considered for implementing a circuit, where said cost is a time cost, and where, for k>1, cost (G,k) is the minimum cost of getting k different signals to node G from gates of the same type and where said cost(G,1) is the minimum cost of implementing a complete subtree rooted at node G, and whereby said combinational logic circuit can be optimized without recourse to a potentially very time-consuming and memory consuming pattern matching procedure required to identify, in a technology-dependent cell library, optimal cell that can be used to replace a subtree that is rooted at node G.

6. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees, for said at least one INPUT node, tiling a ROOT node of said combinational logic circuit with a tile that minimizes a cost(G,1) for the root node;

(c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for $k=1, \ldots, N_{MAX}$, where $N_{MAX}$ is the maximum number of inputs of a cell that will be considered for implementing a circuit, where said cost is a time cost, and where, for $k>1$, cost (G,k) is the minimum cost of getting k different signals to node G from gates of the same type and where said cost(G,1) is the minimum cost of implementing a complete subtree rooted at node G, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G, for each subtree that has an output node terminating on an input of a tile used to tile said representation, tiling a ROOT node of said subtree with a tile that minimizes the cost(G,1) for the root node of said subtree.

7. A method of implementing a combinational logic circuit using cells from a library of technology-specific cells, said library containing a cost (C) for each cell C in the library, said method comprising the steps of:

(a) producing a representation of said circuit that is equivalent to a directed acyclic graph, said representation including at least one INPUT node on which can be applied an associated input signal ad including an OUTPUT mode on which is produced an output signal;

(b) decomposing said representation into trees, for said at least one INPUT node, tiling a ROOT node of said combinational logic circuit with a tile that minimizes a cost(G,1) for the root node;

(c) representing each tree as a reduced circuit expressed in terms only of gates selected from the class consisting of:

a first gate selected form the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for $k=1, \ldots, N_{MAX}$, where $N_{MAX}$ is the maximum number of inputs of a cell that will be considered for implementing a circuit, where said cost is a time cost, and where, for $k>1$, cost (G,k) is the minimum cost of getting k different signals to node G from gates of the same type and where said cost(G,1) is the minimum cost of implementing a complete subtree rooted at node G, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G, for each subtree that has an output node terminating on an input of a tile used to tile said representation, tiling a ROOT node of said subtree with a tile that minimizes the cost(G,1) for the root node of said subtree, and repeating step (d) until the entire circuit has been covered with tiles.

8. A method of implementing a combinational logic circuit using cells from a library of technology-specific cells, sad library containing a cost (C) for each cell C in the library, said method comprising the steps of:

(a) producing a representation of said circuit that is equivalent to a directed acyclic graph, said representation including at least one INPUT node on which can be applied an associated input signal and including an OUTPUT node on which is produced an output signal;

(b) decomposing said representation into trees, for said at least one INPUT node, tiling a ROOT node of said combinational logic circuit with a tile that minimizes a cost(G,1) for the root node, (c) representing each tree as a reduced circuit expressed in terms only of gates selected from the class consisting of:

a first gate selected from the set {2-input OR gate, 2-input NOR gate}, a second gate selected from the set {2-input AND gate; 2-input NAND gate}, and an INVERTER; and (d) for each tree, in a levelized input-to-output order, determining a cost(G,k) for each node G and for $k=1, \ldots, N_{MAX}$, where $N_{MAX}$ is the maximum number of inputs of a cell that will be considered for implementing a circuit, where said cost is a time cost, and where, for $k>1$, cost (G,k) is the minimum cost of getting k different signals to node G from gates of the same type and where said cost(G,1) is the minimum cost of implementing a complete subtree rooted at node G, and whereby said combinational logic circuit can be optimized without recourse to a potentially very time-consuming and memory consuming pattern matching procedure required to identify, in a technology-dependent cell library, an optimal cell that can be used to replace a subtree that is rooted at node G, wherein said library includes basic cells and complex cells, and wherein said method further comprising step (c1) of selecting a complex cell in the library as a tile.

* * * * *